United States Patent
Chung et al.

(10) Patent No.: US 10,320,494 B2
(45) Date of Patent: *Jun. 11, 2019

(54) RF TESTING SYSTEM USING INTEGRATED CIRCUIT

(71) Applicant: MediaTek Inc., Hsin-Chu (TW)

(72) Inventors: Yuan-Hwui Chung, Tainan (TW); Chung-Chin Tsai, Taichung (TW); Ping-Hsuan Tsu, Taipei (TW); Chun-Hsien Peng, Xinyi Township, Nantou County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/074,978

(22) Filed: Mar. 18, 2016

(65) Prior Publication Data

US 2016/0204881 A1 Jul. 14, 2016

Related U.S. Application Data

(63) Continuation-in-part of application No. 14/696,807, filed on Apr. 27, 2015, now Pat. No. 10,110,325, (Continued)

(51) Int. Cl.
*H04B 17/00* (2015.01)
*H04B 17/29* (2015.01)
(Continued)

(52) U.S. Cl.
CPC ......... *H04B 17/00* (2013.01); *G01R 31/2822* (2013.01); *H04B 17/0085* (2013.01);
(Continued)

(58) Field of Classification Search
CPC ........ H04B 17/00; H04B 17/19; H04B 17/29; H04B 17/0085
See application file for complete search history.

(56) References Cited

U.S. PATENT DOCUMENTS 6,543,034 B1 * 4/2003 Goff ............... G01R 31/318357
716/136
7,184,466 B1 2/2007 Seemann et al.
(Continued)

FOREIGN PATENT DOCUMENTS

CN 1354503 A 6/2002
CN 1685239 A 10/2005
(Continued)

OTHER PUBLICATIONS

Kore, I., et al.; "Multi-Site Test of RF Transceivers on Low-Cost Digital ATE;" International Test Conference; IEEE; 2006; pp. 1-10.
(Continued)

*Primary Examiner* — Pablo N Tran
(74) *Attorney, Agent, or Firm* — McClure, Qualey & Rodack, LLP

(57) ABSTRACT

An integrated circuit (IC) is provided. The IC includes an RF transmitter and an RF receiver. The RF transmitter is configured to generate an RF signal in response to an analog test signal from a test signal generator of a module circuitry that is external to the IC. The RF receiver is configured to generate an outgoing signal according to an input RF signal, and to report the outgoing signal to the module circuitry. The module circuitry performs a test analysis on the RF signal generated by the RF transmitter or on the outgoing signal generated by the RF receiver to determine a test result. The test result is reported to a test equipment having no RF instruments.

21 Claims, 24 Drawing Sheets

Related U.S. Application Data which is a continuation of application No. 14/054,213, filed on Oct. 15, 2013, now abandoned, and a continuation-in-part of application No. 13/480,969, filed on May 25, 2012, now Pat. No. 9,041,421.

(60) Provisional application No. 62/135,325, filed on Mar. 19, 2015, provisional application No. 61/731,845, filed on Nov. 30, 2012, provisional application No. 61/496,451, filed on Jun. 13, 2011.

(51) Int. Cl.
  *H04B 17/19* (2015.01)
  *G01R 31/28* (2006.01)
  *G01R 31/317* (2006.01)

(52) U.S. Cl.
  CPC ............ *H04B 17/19* (2015.01); *H04B 17/29* (2015.01); *G01R 31/31716* (2013.01)

(56) References Cited

U.S. PATENT DOCUMENTS

| | | | |
|---|---|---|---|
| 7,675,309 B2 * | 3/2010 | Wu | G01R 31/3025 324/750.3 |
| 7,679,391 B2 * | 3/2010 | Watanabe | G01R 31/31908 324/750.3 |
| 7,688,058 B2 * | 3/2010 | Jenkins | G01R 23/16 324/76.19 |
| 7,724,842 B2 * | 5/2010 | Luce | H04L 27/0014 375/316 |
| 9,525,500 B2 * | 12/2016 | Liu | H04B 17/0085 |
| 9,806,828 B2 * | 10/2017 | Wilson | H04B 17/0085 |
| 9,983,258 B2 * | 5/2018 | Zhang | G01R 31/2822 |
| 2004/0243899 A1 | 12/2004 | Bonneau et al. | |
| 2005/0079822 A1 * | 4/2005 | Boose | G01R 31/31709 455/67.11 |
| 2007/0232240 A1 | 10/2007 | Wu et al. | |
| 2007/0297537 A1 | 12/2007 | Luce | |
| 2009/0201039 A1 | 8/2009 | Wu et al. | |
| 2010/0007366 A1 | 1/2010 | Watanabe et al. | |
| 2010/0227574 A1 * | 9/2010 | Kuenen | G01R 31/2884 455/115.2 |
| 2010/0232489 A1 | 9/2010 | Watkins | |
| 2012/0126821 A1 * | 5/2012 | Forstner | G01R 31/3187 324/537 |
| 2014/0187170 A1 | 7/2014 | Forstner | |
| 2016/0041221 A1 | 2/2016 | Forstner | |
| 2016/0077196 A1 * | 3/2016 | Dehlink | G01R 31/2822 342/169 |

FOREIGN PATENT DOCUMENTS

| | | |
|---|---|---|
| CN | 1805296 A | 7/2006 |
| CN | 101304542 A | 11/2008 |
| CN | 101374317 | 2/2009 |
| CN | 101453279 A | 6/2009 |
| CN | 101464491 | 6/2009 |
| CN | 101464491 A * | 6/2009 |
| CN | 101753227 | 6/2010 |
| CN | 101784904 | 7/2010 |
| CN | 102089669 | 6/2011 |
| CN | 102495353 | 6/2012 |
| CN | 102540052 | 7/2012 |
| CN | 103077731 A | 5/2013 |
| CN | 103376757 A | 10/2013 |
| DE | 102011086818 | 5/2012 |
| JP | 2008151718 | 7/2008 |
| TW | 201038956 | 11/2010 |
| WO | WO 2006/113460 | 10/2006 |
| WO | WO 2009/022313 | 2/2009 |
| WO | WO 2010/004751 | 1/2010 |
| WO | WO 2010/049853 | 5/2010 |

OTHER PUBLICATIONS

Erdogan, E.S., et al.; "Detailed Characterization of Transceiver Parameters;" IEEE Transactions on Very Large Scal Integrating (VLSI) Systems; vol. 18; No. 6; Jun. 2010; pp. 1-11.

Huang, Y.C., et al.; "A Low-Noise Amplifier with Integrated Current and Power Sensors for RF BIST Applications;" 25th IEEE VLSI Test Symmposium; 2007; pp. 1-6.

Berger, R.W., et al.; "Part IV: Product and Process Control;" The Certified Quality Engineer Handbook; 2008; pp. 209-211.

English language translation of "Part IV: Product and Process Control;" The Certified Quality Engineer Handbook; 2008; pp. 209-211.

* cited by examiner

RF TESTING SYSTEM USING INTEGRATED CIRCUIT

CROSS REFERENCE TO RELATED APPLICATIONS

This application claims the benefit of U.S. Provisional Application No. 62/135,325, filed on Mar. 19, 2015. This application is also a Continuation-In-Part of application Ser. No. 14/696,807, filed on Apr. 27, 2015, which is a Continuation of U.S. patent application Ser. No. 14/054,213, filed on Oct. 15, 2013, which claims benefit of U.S. Provisional Application No. 61/731,845, filed on Nov. 30, 2012. Application Ser. No. 14/696,807 is also a Continuation-In-Part of U.S. patent application Ser. No. 13/480,969, filed on May 25, 2012 (now U.S. Pat. No. 9,041,421), which claims the benefit of provisional Application No. 61/496,451, filed on Jun. 13, 2011, the entirety of which are incorporated by reference herein.

BACKGROUND OF THE INVENTION

Field of the Invention

The present invention relates to semiconductor devices, and in particular to radio frequency (RF) testing systems for semiconductor devices.

Description of the Related Art

Semiconductor devices are manufactured in the form of wafers comprising many thousands of devices. The wafers are diced into dies and packaged into integrated circuits (IC). Each IC has been implemented by integrating more and more digital and analog circuits into a single chip.

Due to the increasing complexity of the testing of integrated RF circuits, to identify the "good" and "bad" ICs during production is a challenging problem for those conducting the wafer-level test or final test. In the traditional testing of RF circuits, what is used is expensive automatic test equipment (ATE), such as UltraFlex or Flex with RF instruments, or equipment used in mixing signals is used for generating an RF test signal (or RF patterns) to a device under test (DUT) and processing RF signals emanating from the DUT, leading to increased cost and time to conduct the tests.

In addition, a system-on-chip (SoC) usually includes RF or analog circuits, digital baseband circuits, and digital processing units, and the RF or analog circuits are located in the analog die of the SoC while the digital baseband circuits and digital processing units are located in the digital die of the SoC. However, a stand-alone RF or analog IC does not have digital components. Specifically, the SoC is capable of performing on-chip RF testing by its internal embedded digital signal processor (DSP), but the stand-alone RF or analog IC is not able to do on-chip RF testing due to lack of a DSP. Furthermore, it usually requires automatic test equipment with expensive RF instruments to test the RF or analog circuits with high complexity.

Therefore, there is a need for an effective RF test technique for transceivers that can solve the above-mentioned problems.

BRIEF SUMMARY OF THE INVENTION

A detailed description is given in the following embodiments with reference to the accompanying drawings.

In an exemplary embodiment, an integrated circuit (IC) is provided. The IC includes an RF transmitter and an RF receiver. The RF transmitter is configured to generate an RF signal in response to an analog test signal from a test signal generator of a module circuitry that is external to the IC. The RF receiver is configured to generate an outgoing signal according to an input RF signal, and to report the outgoing signal to the module circuitry. The module circuitry performs a test analysis on the RF signal generated by the RF transmitter or on the outgoing signal generated by the RF receiver to determine a test result. The test result is reported to a test equipment having no RF instruments.

In another exemplary embodiment, a module circuitry for testing a device-under-test is provided. The module circuitry includes: a test signal generator, configured to generate a test signal; a test analyzer, configured to performs a test analysis on an RF signal generated by the device-under-test or on an analog signal generated by the device-under-test to determine a test result; and a controller that controls the test signal generator to generate the test signal and controls the test analyzer to generate the test result.

In another exemplary embodiment, a radio frequency (RF) testing system is provided. The RF testing system comprises: a module circuitry; a test equipment, configured to upload test patterns to the module circuitry; and a device-under-test configured to generate an RF signal or an analog signal in response to a test signal from the module circuitry, wherein the module circuitry generates the test signal according to the uploaded test patterns, wherein the module circuitry performs a test analysis on the RF signal or the analog signal to determine a test result, and the test equipment receives the test result from the module circuitry, wherein the module circuitry is external to the IC and the test equipment.

In some aspects of the disclosure, the module circuitry includes one integrated circuit that is capable of generating test signals, performing test analysis to determine a test result, and controlling the flow of RF tests.

In some aspects of the disclosure, the module circuitry includes a first integrated circuit and a second integrated circuit. The first integrated circuit is capable of performing signal up-conversion and signal down-conversion. The second integrated circuit is capable of generating test signals, performing test analysis to determine a test result, and controlling the flow of RF tests.

In some aspects of the disclosure, the module circuitry includes one integrated circuit that is capable of performing signal up-conversion and signal down-conversion, generating test signals, performing test analysis to determine a test result, and controlling the flow of RF tests.

In some aspects of the disclosure, the integrated circuit includes a processor having a plurality of processing cores, and the processing cores are utilized to perform the test analysis in parallel.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
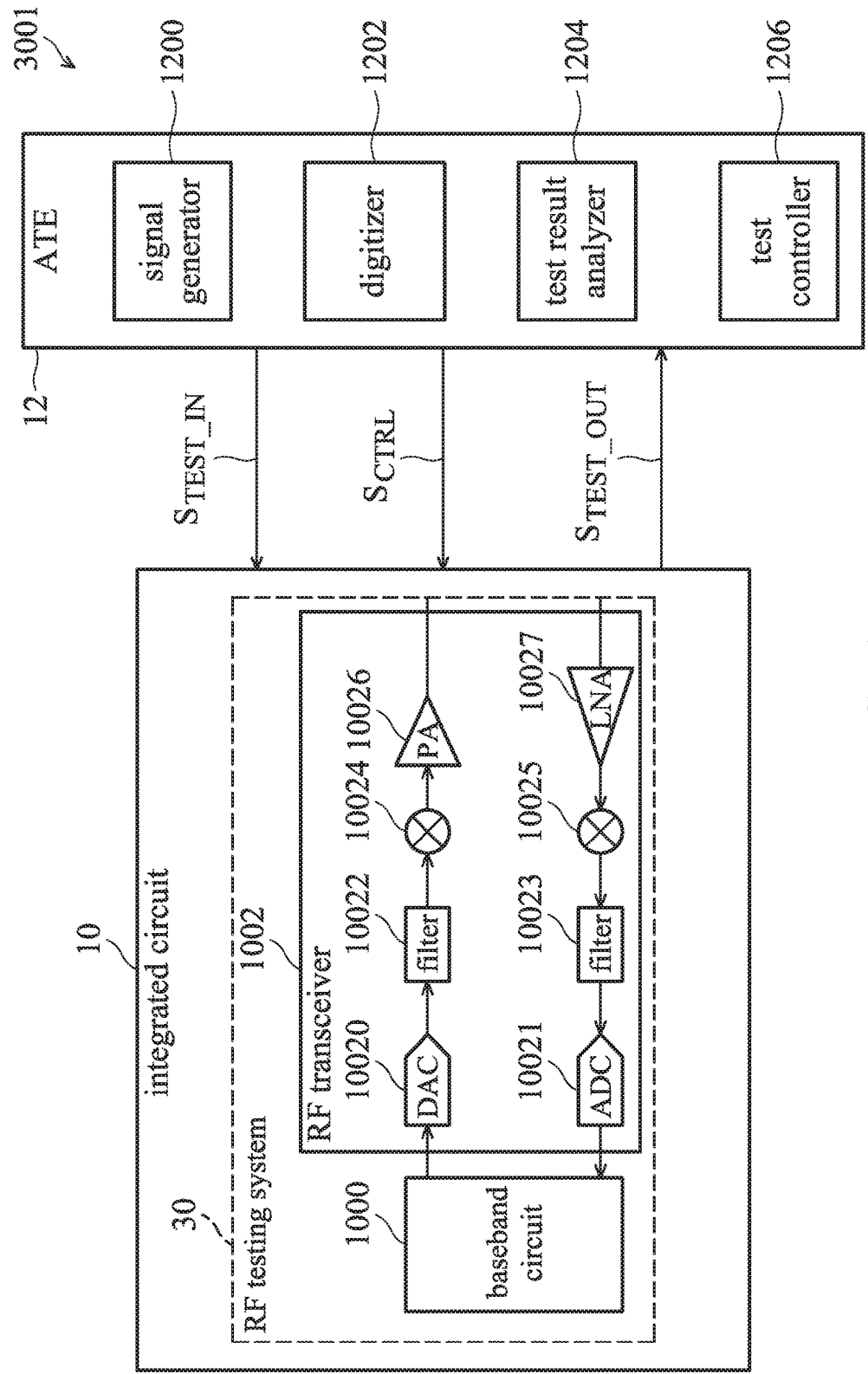
FIG. 1 is a block diagram of a conventional radio frequency (RF) testing system 1.

FIG. 1 is a block diagram of a conventional radio frequency (RF) testing system 3001. As illustrated in FIG. 1, the RF testing system 3001 comprises an integration circuit (IC) 10 and automatic test equipment (ATE) 12. The ATE 12 applies semiconductor testing for digital and analog elements in the IC 10 during the hardware manufacturing procedure. The IC 10 is a device under test (DUT) that receives power and testing patterns from the ATE 12 and outputs testing responses to the ATE 12. The ATE 12 is an electronic apparatus that receives a test program and performs tests accordingly on the DUT by supplying stimulus signals. The ATE 12 also receives outcome signals, takes signal measurements, evaluates test results based on the signal measurements, and determines whether the DUT is good or bad. The ATE 12 comprises a signal generator 1200, a digitizer 1202, a test result analyzer 1204 and a test controller 1206. The test controller 1206 sends a test control signal $S_{CTRL}$ to control all the registers in the IC 10 by some digital or analog pins to operate under a test mode. The signal generator 1200 may provide an analog signal or/and RF signal (test pattern $S_{TEST\_IN}$) to be injected into the IC 10 for the test of RF circuits. The digitizer 1202 digitizes an output response $S_{TEST\_OUT}$ from the IC 10 and converts analog signal or/and RF signal to digital signal. The test result analyzer 1204 analyzes the evaluated signal performance of the digitized signal to determine whether the DUT has any faulty components for the wafer-level test or final test.

The IC 10 in FIG. 1 includes an RF testing system 30, which comprises a baseband circuit 1000 and an RF transceiver 1002. The ATE 12 performs an RF test to the IC 10, particularly to all transceivers for various communication systems adopted by the IC 10 by feeding the analog or/and RF test pattern $S_{TEST\_IN}$ into the IC 10. The RF testing system 30 illustrates a transmitter path and receiver path, wherein the transmitter path comprising a digital-to-analog converter (DAC) 10020, a filter 10022, a modulator 10024, and a power amplifier (PA) 10026, and the receiver path comprising a low noise amplifier (LNA) 10027, a demodulator 10025, a filter 10023, and an analog-to-digital converter (ADC) 10021. For an RF test, the signal generator 1200 in the ATE 12 generates and injects a test pattern $S_{TEST\_IN}$ in high frequency to a testing interface (not shown) for testing the RF receiver in the RF testing system 30. The ATE 12 may further receive analog or/and RF signal $S_{TEST\_OUT}$ from the output of the transmitter path to evaluate the quality of transmitter of the IC 10.

In the conventional RF test, the ATE 12 supplies the analog or/and RF test pattern $S_{TEST\_IN}$ to the IC 10 and receives the analog or/and RF output response $S_{TEST\_OUT}$ from the IC 10, therefore there is high-speed communication between the ATE 12 and the IC 10, requiring the ATE 12 to work at a high speed, resulting in an increased cost of the ATE 12.

Figure 2:
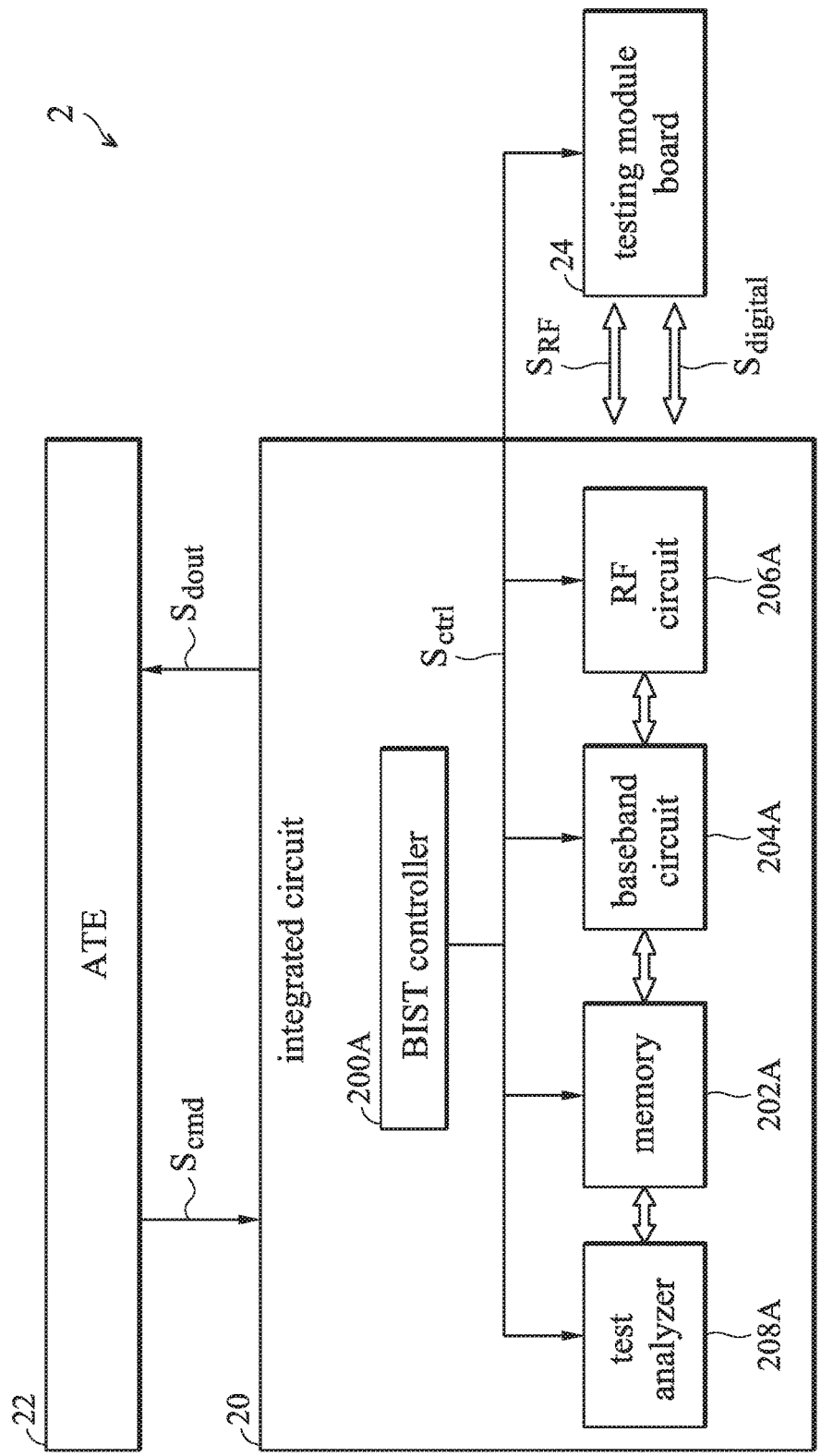
FIG. 2 is a block diagram of an RF built-in-self-test (BIST) system 2 according to an embodiment of the invention.

FIG. 2 is a block diagram of an RF BIST system 2 according to an embodiment of the invention, comprising an IC 20, an ATE 22, and a testing module board 24. The ATE 22 initializes an RF BIST by sending a command signal $S_{cmd}$ to the IC 20. In response, the IC 20 is arranged to enter into a test mode, and, in contrast to the ATE 22 controlling the test process in the conventional approach, the IC 20 takes controls of the test operations, which aims to locate defected building elements in a mixed mode circuitry or an analog circuitry in the IC 20. Under the test mode, the IC 20 communicates with the testing module board 24 using RF signals $S_{RF}$ and digital signals $S_{digital}$. The IC 20 may transmit RF signals $S_{RF}$ to the testing module board 24 for transmission performance evaluation or receive RF signals $S_{RF}$ from the testing module board 24, which is generated by the testing module board 24 itself or the IC 20 itself passing through the testing module board 24 using an external loopback path, to evaluate reception performance of the IC 20. The digital signals $S_{digital}$ may be an evaluation signal produced and sent by the testing module board 24 to the IC 20 for a test analysis. The testing module board 24 is external to the IC 20 and ATE 22, comprises discrete components thereon to assist signal property analysis as well as RF testing signal generation and receive a control signal $S_{ctrl}$ from the IC 20 in the test mode. In some implementations, an RF circuit 206A in the IC 20 may comprise RF transmitter to generate RF signal and RF receiver to receive RF signal from IC 20 itself by internal loopback path or testing module board 24. The quality of RF transmitter in RF circuit 206A may be evaluate by testing module board and/or IC 20 itself with a test analyzer 208A through internal or external loopback path. The RF receiver in RF circuit 206A also may be as a DUT to receive an RF signal from testing module board or IC 20 itself through internal or external loopback path and convert the RF signal to digital baseband signal. Consequently, the test analyzer 208A may be used to analyze captured digital signal saved in memory 202A and evaluate the quality of RF receive in RF circuit 206A.

The ATE 22 is capable of initiating various RF BISTs to the IC 20, including a single tone or one-tone test, a two-tone test, a multi-tone test, a noise figure (NF) test, a lock time test, a modulation test, etc. The ATE 22 may send the command signal or digital pattern $S_{cmd}$ informing the IC 20 of the type of the BIST that is to perform, so that the IC 20 can load corresponding test patterns internally according to the command signal $S_{cmd}$. The ATE 22 may transmit the digital pattern $S_{cmd}$ initiating one or more RF BIST types to IC 20.

The IC 20 in FIG. 2, comprises a BIST controller 200, a test analyzer 202A, a memory module 204A, a baseband circuit 206A, and an RF circuit 206A.

The BIST controller 200A is internally coupled to the memory module 202, the baseband circuit 204A, the RF circuit 206A, and a test analyzer 208A, and externally coupled to the testing module board 24 to take control of the test operations through the control signal $S_{ctrl}$. The control signal $S_{ctrl}$ is a baseband signal having a frequency close to zero, and may be in digital or analog form. The BIST controller 200A controls the testing module board 24 to operate under the test mode through the control signal $S_{ctrl}$.

The memory module 202A and the baseband circuit 204A may be implemented as a signal generator, which is programmed to sequentially perform various tests by producing and injecting the test patterns into the RF circuit 206A for the tests including the one-tone test, the two-tone test, the multi-tone test, the NF test, the lock time test, the modulation test, etc. In some implementations, the memory module 202A is also served as a temporary data storage for captured baseband signals from the baseband circuit 204A or RF BIST results from the test analyzer 208A. The test analyzer 208A can be used to measure power at frequency associated with wanted tone, image tone or second-order or third-order harmonics to test transmitter/receiver gain, image rejection ratio (IRR), input second intercept point (IIP2), input third intercept point (IIP3), etc. In test analyzer 208A, we can implement a noise power estimator to calculate noise power or signal-to-noise ratio (SNR) of receiver for NF test. The lock time measure can also be implemented by software or hardware in the test analyzer 208A to test the lock time of a phase-locked loop (PLL) which comprises the instantaneous frequency estimation, lock time calculation using the information of the frequency estimates, and pass/fail decision. Some estimators of modulated tests such as error vector magnitude (EVM) and spectrum estimators can also be implemented in the test analyzer 208A to evaluate the quality of RF transmitter in RF circuit 206A.

The transmitter path is usually tested at the system level test by the EVM and spectrum, nonlinearity tests such as IIP2 and IIP3, an image signal test, a carrier leakage test, and a transmission power test. The evaluated characteristics for the receiver path comprise a receiver gain test, an image signal test, a DC offset test, NF test, and nonlinearity test such as IIP2 and IIP3.

The RF circuit 206A comprises building circuit elements for an RF transmitter and an RF receiver, including a DAC, an ADC, a filter, a modulator, a demodulator, a local oscillator, a PA, and an LNA. The BIST may be applied to test a single element or a circuit in the RF circuit 206A or whole transmission or reception path. The test analyzer 208A receives the evaluation signals from either the testing module board 24 or the RF circuit 206A to determine a test result signal $S_{dout}$ indicative of whether the DUT has passed or failed the test, and then reports the test result signal $S_{dout}$ to the ATE 22. The command signal $S_{cmd}$ and the test result signal $S_{dout}$ are baseband signals that are at a frequency substantially close to zero, and may be in digital or analog form.

In some implementations, the IC 20 can further comprise a compensator (not shown) to compensate or adjust parameters for the RF circuit elements 206A using digital or analog circuit based on evaluated characteristics of the captured digital signal in test analyzer. In comparison to the conventional RF approach, the present embodiment depicts an RF BIST system where the ATE 22 is only used to initiate the test and keep the test results. The RF BIST tasks including test pattern generation, signal analysis, and test result justification are now shifted to either the IC 20 or the testing module board 24. Consequently, circuit complexity of the ATE 22 can be reduced, thereby decreasing design and manufacturing cost of the ATE 22. Further, the testing module board 24 is included in the test to assist evaluation of the signal characteristics for the signature response, or loop back the transmitter response to the RF receiver. Thus, there are a high-speed communication $S_{RF}$ between the IC 20 and testing module board 24.

Figure 3:
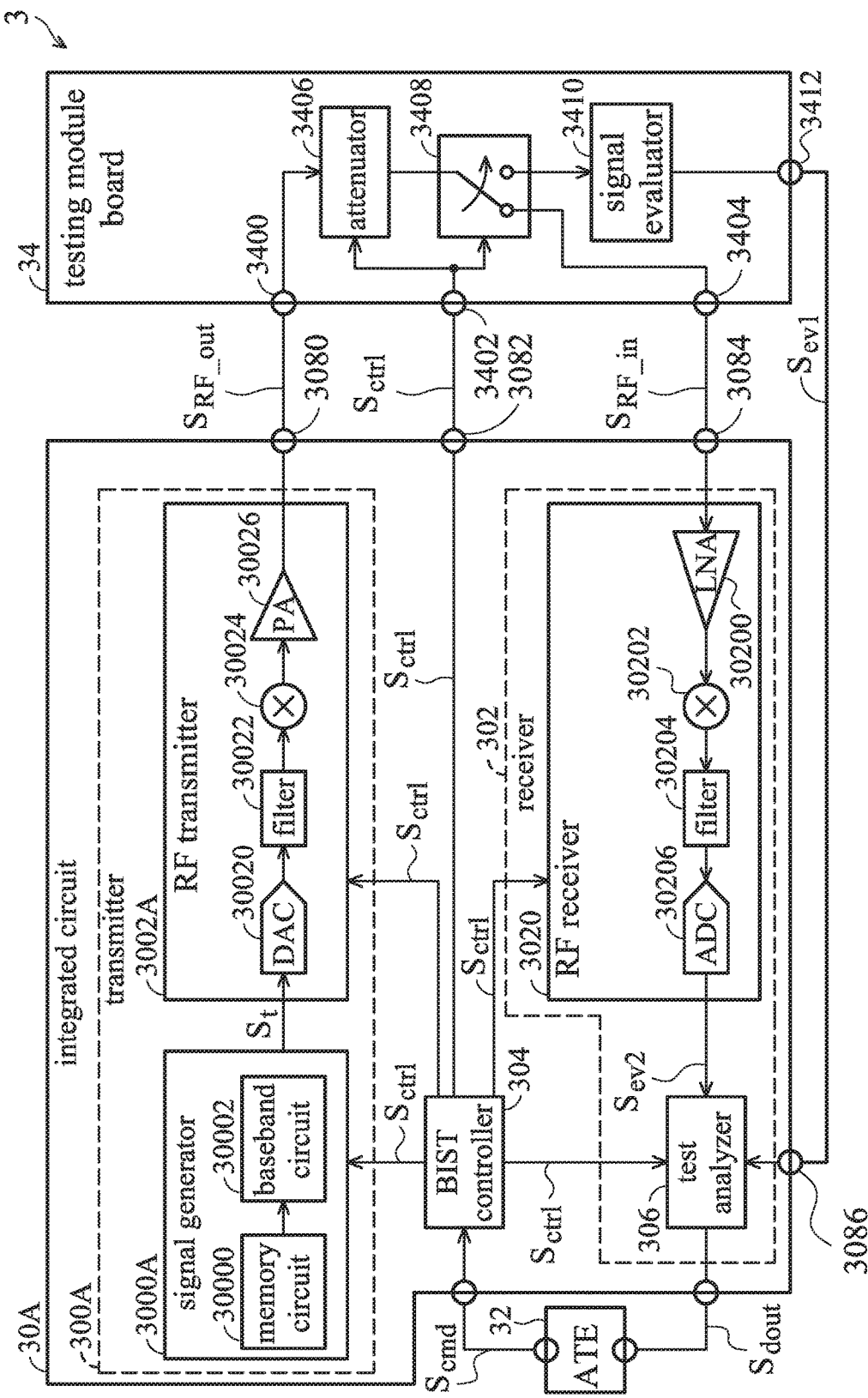
FIG. 3 is a block diagram of an RF BIST system 3 according to another embodiment of the invention.

FIG. 3 shows a block diagram of an RF BIST system 3 according to an embodiment of the invention, comprising an IC 30, an ATE 32, and a testing module board 34. The ATE 32 carries out an RF BIST by initiating a baseband command signal $S_{cmd}$ to the IC 30A. In response, the IC 30A enters a test mode and generates a test pattern signal $S_t$ internally. The test pattern $S_t$ is sent to a RF transmitter 3002A to undergo various analog circuit passing in the transmitter path, rendering an outgoing RF signal $S_{RF\_out}$, which is further sent to the testing module board 34 to perform signal analysis. The testing module board 34 exhibits two configurations in the embodiment, one configuration performs signal analysis on the outgoing RF signal $S_{RF\_out}$ to produce a first evaluation signal $S_{ev1}$, and the other configuration loops the outgoing RF signal $S_{RF\_out}$ back to a receiver 302 in the IC 30A. Since the outgoing signal $S_{RF\_out}$ is RF signal passing analog circuits in the transmitter path, it bears information on the circuit elements. In the signal analysis configuration, the testing module board 34 can evaluate electrical characteristics of the target circuit element based on the outgoing RF signal $S_{RF\_out}$ to output a first baseband evaluation signal $S_{ev1}$, which is further reported back to the IC 30A. Based on the first evaluation signal $S_{ev1}$, the IC 30A then determines and reports a test result signal $S_{dout}$ back to the ATE 32, informing the ATE 32 whether the DUT has passed or failed the test. In the loopback configuration, the outgoing RF signal $S_{RF\_out}$ is transferred to the receiver 302 to undergo RF impairments in a receiver path, outputting a second baseband evaluation signal $S_{ev2}$ to the test result analyzer 306. The second baseband evaluation signal $S_{ev2}$ can be used by the test result analyzer 306 to determine electrical characteristics and functional validity of a receiver circuit element on the receiver path. The command signal $S_{cmd}$ and the test result signal $S_{dout}$ are baseband signals that are at a frequency substantially close to zero, and may be in digital or analog form.

The IC 30A comprises a transmitter 300A, a receiver 302, and a BIST controller 304. The transmitter 300A and the receiver 302 may belong to the same or different transceiver systems. For examples, the transmitter 300A and the receiver 302 may both belong to a WLAN system, or may belong to a WLAN system and a Bluetooth system respectively. The transmitter 300A further comprises a signal generator 3000A and a RF transmitter 3002A. In some implementations, the signal generator 3000A comprises a memory 30000 that keeps various test patterns for BISTs therein and a baseband circuit 30002 that performs digital power control (not shown) and/or digital compensations (not shown) such as in-phase/quadrature (IQ) mismatch and digital pre-distortion. The RF transmitter 3002A comprises a DAC 30020, a filter 30022, a modulator 30024, and a PA 30026. Similarly, the RF receiver 3020 comprises an LNA 30200, a demodulator 30202, a filter 30204, and an ADC 30206. The modulator 30024 and demodulator 30202 may further receive carrier signals from one or more local oscillators (not shown) to modulate and demodulate the outgoing and incoming RF signals respectively. Upon receiving the command signal $S_{cmd}$, the BIST controller 304 enables relevant circuit elements in IC 30 including the signal generator 3000A, the RF transmitter 3002A, the test result analyzer 306, and the RF receiver 302 to enter into the test mode and control the external circuit components in testing module board 34 including adjustable attenuator and switch. In some implementations, a digital filter is present between the ADC 30206 and the test result analyzer 306. In some implementations, the BIST controller 304 also controls the testing module board 32 to operate under the test mode. The test signal generator 3000A is arranged to generate the test signal $S_t$ in response to the command signal $S_{cmd}$. After test signal $S_t$ is fed into the RF transmitter 3002A, the RF transmitter 3002A is arranged to generate the response signal $S_{RF\_out}$. The test result analyzer 306 may be implemented by a digital signal processing (DSP) unit or hardware circuits, and arranged to determine and report the test result signal $S_{dout}$ to the ATE 32. The test result signal $S_{dout}$ is determined based on the first evaluation signal $S_{ev1}$ and processed results of the second evaluation signal $S_{ev2}$. Specifically, in some implementations, the test result signal $S_{dout}$ is determined based on a first evaluation signal $S_{ev1}$ derived from the RF signal $S_{RF\_out}$. In other implementations, the test result signal $S_{dout}$ is determined based on the second evaluation signal $S_{ev2}$ which is derived by feeding back the response signal $S_{RF\_out}$ to the RF receiver 3020.

The IC 30A comprises a first communication port 3080, a second communication port 3082, a third communication port 3084, and a fourth communication port 3412 for communication with the testing module board 34. The first communication port 3080 outputs the outgoing RF signal $S_{RF\_out}$ to the testing module board 34 and the third communication port 3084 acquires the incoming RF signal $S_{RF\_in}$ from the testing module board 34. In addition, the two ports 3080 and 3084 need enough isolation for self-test. Consequently the two ports 3080 and 3084 cannot be implemented by a common communication port on the IC 30. The IC 30A directs the control signal $S_{ctrl}$ through the second communication port 3082 to control the testing module board 34. The fourth communication port 3086 receives the results of signal evaluator 3410 from the testing module board 34.

The testing module board 34 is external to the IC 30A and ATE 32, and comprises an input port 3400, a control port 3402, a loopback port 3404, an adjustable attenuator 3406, a switch 3408, and a signal evaluator 3410 which can be implemented by a power detector, and an output port 3412. In some implementations, a testing load board (not shown) is provided to hold the testing module board 34 and the IC 30A together. The testing load board may comprise an IC socket (not shown) to accept the IC 30A and a module slot (not shown) to hold the testing module board 34 in place during the test. The input port 3400 accepts the response RF signal $S_{RF\_out}$ from the IC 30A. The control port 3402 receives the control signal $S_{ctrl}$ from the IC 30A to enable the testing module board 34 work under the test mode. The control signal $S_{ctrl}$ controls the attenuator 3406 and the switch 3408. The attenuator 3406 receives controls by the control signal $S_{ctrl}$ to adjust attenuation level to the RF signal $S_{RF\_out}$. The switch 3408 is selected by the control signal $S_{ctrl}$ to switch between the signal analysis configuration and the loopback configuration. In the signal analysis configuration, the transmitter response signal $S_{RF\_out}$ is transferred to the signal evaluator 3410 to determine a power level or a baseband signal thereof as the first evaluation signal $S_{ev1}$, which is reported back to the IC 30 through the output port 3412. In the loopback configuration, the transmitter output signal $S_{RF\_out}$ is looped back through the attenuator 3406 as an input RF signal $S_{RF\_in}$ to the RF receiver 3020 for a further test in the receiver path. In the receiver, the input RF signal $S_{RF\_in}$ is down-converted into the baseband, which is digitized into digital words that are processed by a baseband circuit or DSP.

Although the testing module board 34 accepts the control signal $S_{ctrl}$ from the IC 30A, it should be appreciated by the people skilled in the art that the testing module board 34 can also receive controls from the ATE 32 or provide the control signal by the testing module board 34 locally without deviating from the principle of the invention.

In comparison to the conventional RF test mechanism, the present embodiment depicts an RF BIST system where the ATE 32 is only used to initiate the test and keep the test results. The other RF BIST tasks include test pattern generation, signal analysis, and test result justification, is controlled by the IC 30A and shifted to either the IC 30A or the testing module board 34, leading to a reduction in circuit complexity of the ATE 22, thereby decreasing design and manufacturing cost. Only low-frequency command signal $S_{cmd}$ and test result signal $S_{dout}$ are exchanged between the IC 30A and the ATE 32.

Figure 4:
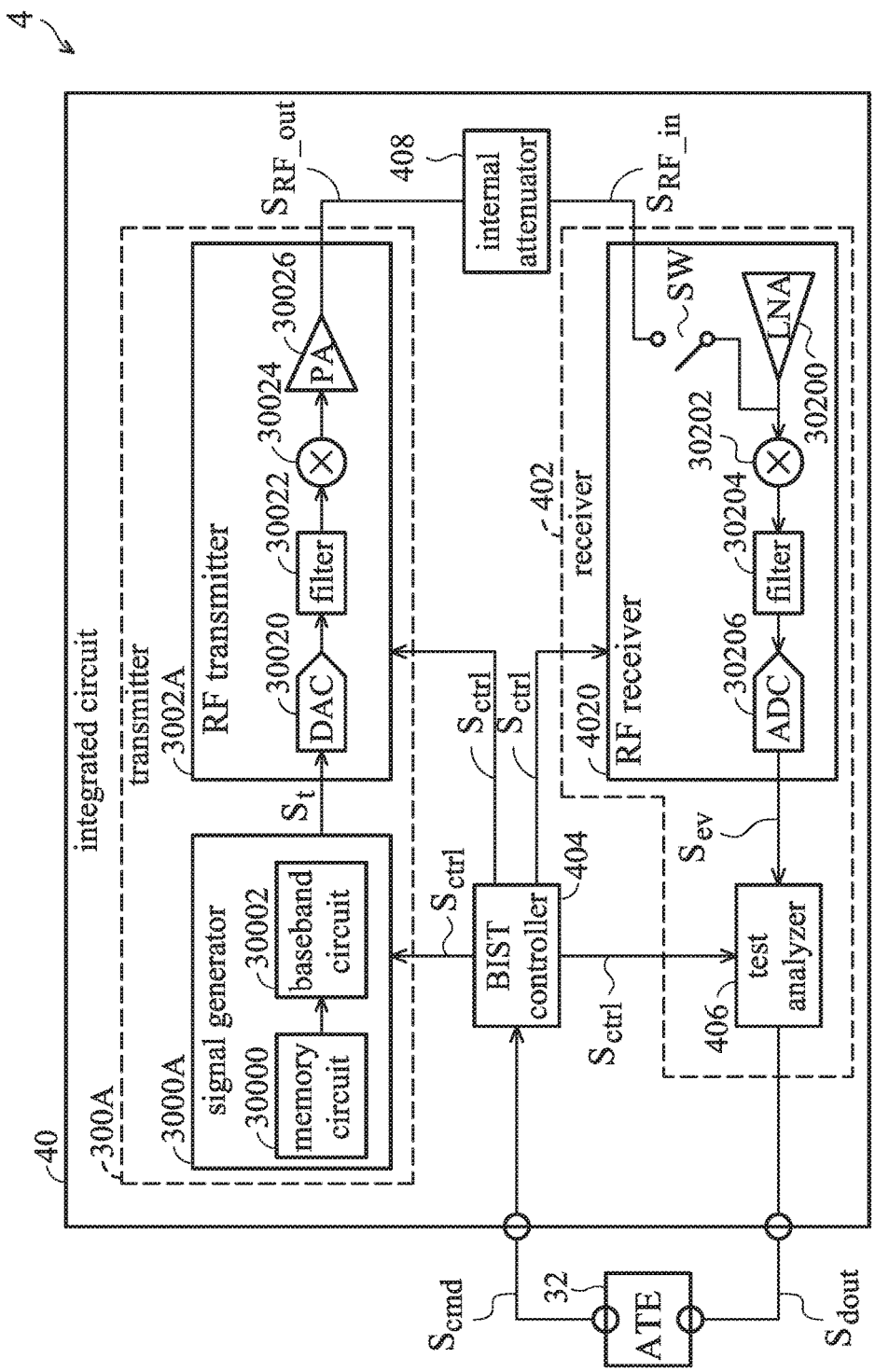
FIG. 4 is a block diagram of an RF BIST system 4 according to another embodiment of the invention.

FIG. 4 is a block diagram of an RF BIST system 4 according to another embodiment of the invention, comprising an integrated circuit 40 and the ATE 32. The circuit configuration in FIG. 4 is identical to that in FIG. 3 except that the outgoing RF signal $S_{RF\_out}$ is looped back through an internal attenuator 408 between the output of the RF transmitter 3002A and the input of RF receiver 4020, such that the signal performance of the RF transmitter 3002A and RF receiver 4020 can be evaluated without uses of the external testing module board 34 in FIG. 3. Upon being triggered by the command signal $S_{cmd}$, the IC 40 is able to run the RF BIST procedure all by itself to evaluate performance of a selected circuit element or a selected circuit path, and report the RF BIST result back to the ATE 32, without aids from any external circuitry.

The RF BIST is performed at a system level, where the transmitter 300A and receiver 402 belong to a same system. The ATE 32 issues the command signal $S_{cmd}$ to the IC 40 to start the test. In response to the command signal $S_{cmd}$, the BIST controller 404 is initialed to enable the test mode and control the RF BIST processes. The signal generator 3000A produces the corresponding test pattern $S_t$, which is processed through the RF transmitter 3002A and the input of RF receiver 4020 to render the evaluation signal $S_{ev}$. The different test patterns $S_t$ can easily be generated by the implementation of signal generator 3000A in the IC 40 to accommodate different test items. Hence, utilizing the test analyzer 406 the quality of the RF transceiver in IC 40 can be evaluated by processing the signal $S_{ev}$ to determine the test result, good or bad, of IC 40 and report the result to the ATE 32. The IC 40 provides the loopback attenuator 408 to loop back the RF signal $S_{RF\_out}$ from the RF transmitter 3002A to RF receiver 4020, thereby eliminating the uses of the testing module board 34 while still able to carry out the most RF BIST processes in the IC 40. Similar to the RF BIST system 3, the RF BIST system 4 utilizes low-frequency communication between the ATE 32 and IC 40, offering a cost reduction in the ATE 32.

Figure 5:
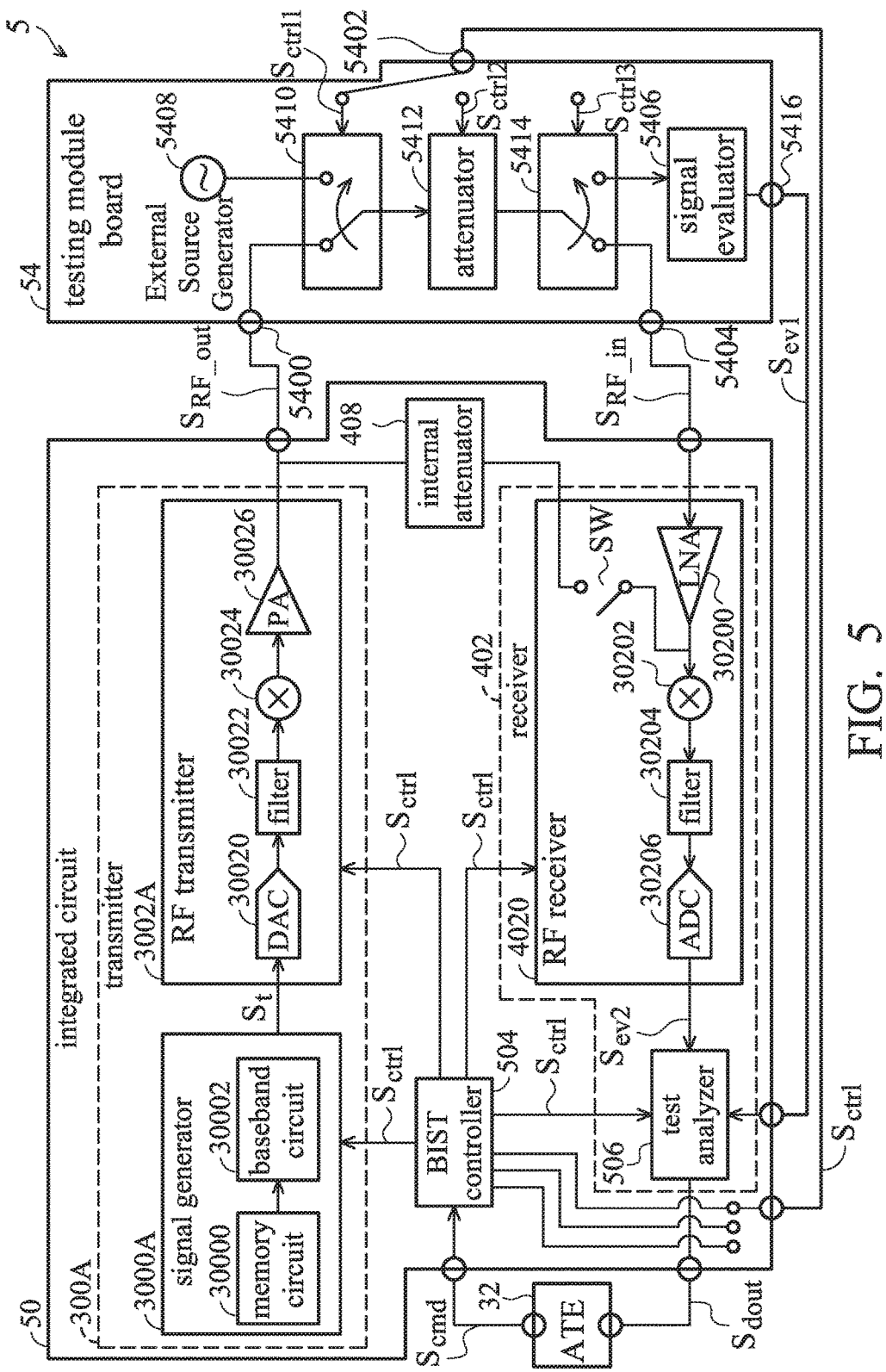
FIG. 5 is a block diagram of an RF BIST system 5 according to yet another embodiment of the invention.

FIG. 5 is a block diagram of an RF BIST system 5 according to yet another embodiment of the invention, comprising an IC 50, an ATE 32, and a testing module board 54. The circuit configuration in FIG. 5 is identical to that in FIG. 4 except that the testing module board 54 is connected to the IC 50. The testing module board 54 is external to the IC 50 and the ATE 32 and comprises circuit elements customized to assist signal analysis of the outgoing RF signal $S_{RF\_out}$, thereby determining the first evaluation signal $S_{ev1}$ indicative of an electrical characteristic of the $S_{RF\_out}$. The testing module board 54 receives control externally from either the IC 50 or the ATE 32. The embodiment in FIG. 5 depicts the case where the testing module board 54 receives a control signal $S_{ctrl}$ from the IC 50 to select performing signal analysis on the transmitter path, or looping the RF signal $S_{RF\_out}$ back to the receiver path, or performing other testing initiated by or measured by the testing module board 54.

The testing module board 54 comprises an input port 5400, a control port 5402, a loopback port 5404, a signal evaluator 5406, an external source generator 5408, a first switch 5410, an attenuator 5412, a second switch 5414, and an output port 5416. The input port 5400 is configured to receive the output RF signal $S_{RF\_out}$ that carries information of the DUT on the transmitter path. In some embodiments, the input port 5400 and loopback port 5404 of the testing module board 54 are implemented by separated ports while the RF transmitter 3002A and RF receiver 4020 on the IC 50 respectively transmit and receive RF signals by separate ports. In other embodiments, the input port 5400 and the loopback port 5404 can be realized by a common port while the RF transmitter 3002A and RF receiver 4020 on the IC 50 respectively transmit and receive RF signals by another common port. The signal evaluator 5406 is configured to be controlled by an external controller, either by the IC 50 or the ATE 32, to evaluate the outgoing RF signal $S_{RF\_out}$ to determine a first evaluation signal $S_{ev1}$ indicating an electrical characteristic of the first test signal. In turn, the first evaluation signal $S_{ev1}$ is output to the IC 50 for a test result analysis through the output port 5416. In some implementations, the signal evaluator 5406 is a power detector monitoring power in the outgoing RF signal $S_{RF\_out}$. In other implementations, the signal evaluator 5406 is a component which includes one or more analog/digital circuit to convert the RF signal to baseband digital signal and sends the digital signal to IC 50 by output port 5416. The external source generator 5408 is configured to generate an RF test pattern that may be injected into the receiver path as a clear source or reference source in order to evaluate the RF receiver 4020. The first switch 5410 is configured to select one of the output signal $S_{RF\_out}$ generated by the IC 50 and the second test pattern generated by external source generator 5408 in the testing module board 54. The attenuator 5412 is configured to generate RF source with different signal levels. The second switch 5414 is configured to select one of performing signal analysis on the transmitter path and providing a test pattern to the receiver path. The testing module board 54 receives the control signal $S_{ctrl}$ from the BIST controller 504 to determine a function implemented thereon. In order words, the BIST controller 504 can respectively control at least one of the first switch 5410, the attenuator 5412 and the second switch 5414 by the control signal $S_{ctrl}$ via the control port 5402.

Although the IC 50 incorporates a transmitter path circuitry and a receiver path circuitry, the person in the art will recognize that the RF BIST therefore may be carried out separately according to the principle of the invention. In some implementations, the IC 50 performs a test only on the transmitter path circuitry, so that the testing module board 54 can evaluate the electrical characteristics of the signature response $S_{RF\_out}$ of the transmitter path to output the evaluation signal $S_{ev1}$ to the test result analyzer 506. In other implementations, the IC 50 performs a test only on the receiver path circuitry, the testing module board 54 assists to provide the test pattern from source generator 5408 to be injected into the RF receiver 4020 to output the evaluation signal $S_{ev2}$ to the test result analyzer 506 for receiver tests such as receiver gain, IQ mismatch, DC offset, and nonlinearity, etc.

The RF BIST system 5 provides the customized testing module board 54, capable of evaluating the signal properties for the response signal $S_{RF\_out}$ of the RF transmitter 3002A and generating a RF test pattern to be injected into the RF receiver 4020, thereby assisting the test signal generation and signal evaluation in the RF BIST processes. Similar to the RF BIST system 3, the RF BIST system 5 utilizes low-frequency communication between the ATE 32 and IC 50, resulting in a cost reduction in the ATE 32.

Figure 6:
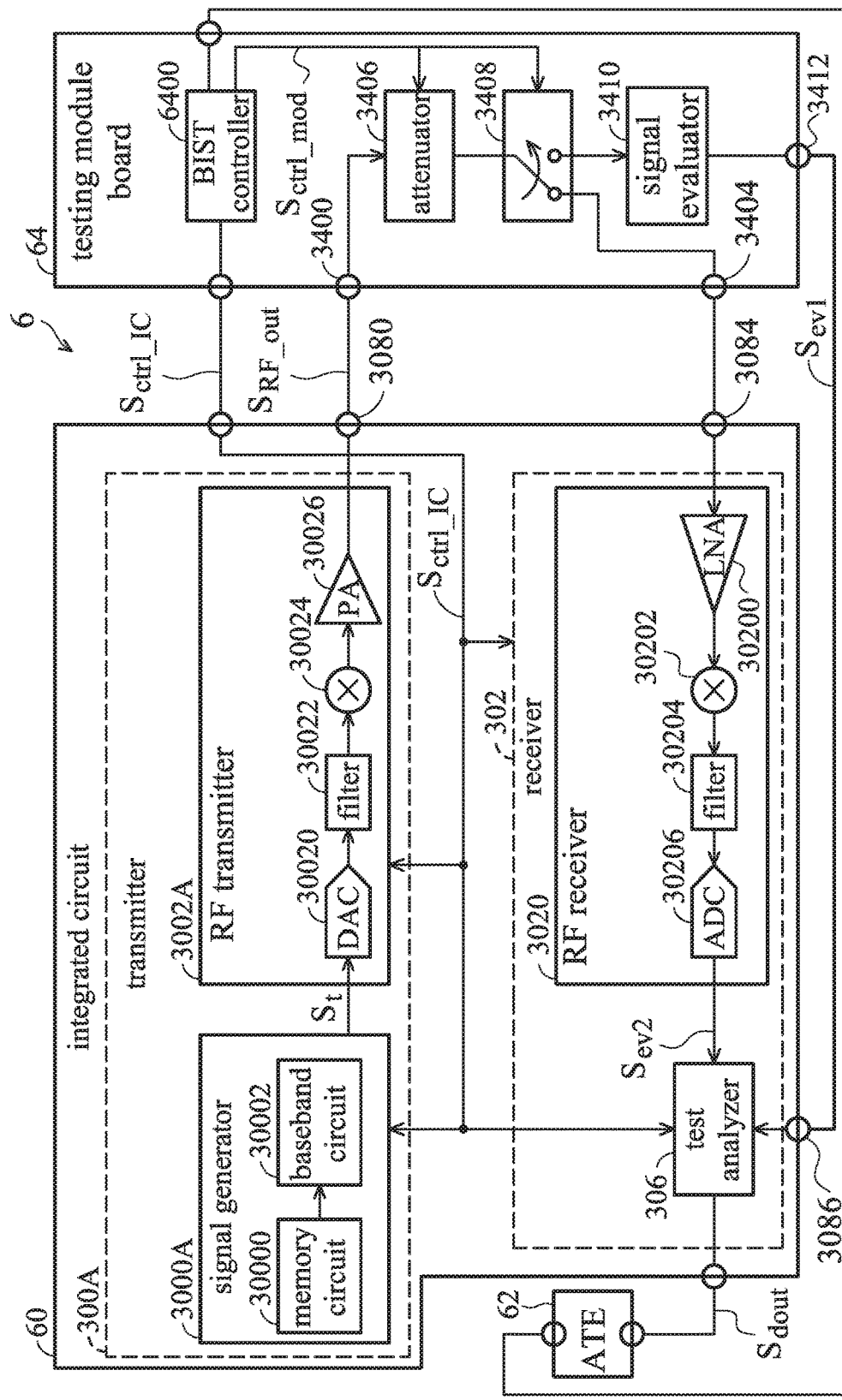
FIG. 6 is a block diagram of an RF BIST system 6 according to still yet another embodiment of the invention.

FIG. 6 is a block diagram of an RF BIST system 6 according to still yet another embodiment of the invention, comprising an integrated circuit 60, an ATE 62, and a testing module board 64. The ATE 62 identical to the ATE 22 and ATE 32 in FIG. 2 and FIG. 3, reference therefor is detailed in the preceding paragraphs. The circuit configuration and connection is identical to that in the RF BIST system 3, except that in the RF BIST system 6, a BIST controller 6400 is placed at the testing module board 64, so that the RF test control can be adapted and managed externally from the IC 60. In the embodiment, the testing module board 64 comprises the BIST controller 6400 which receives a command signal $S_{cmd}$ from the ATE 62 for initiating an RF BIST. Instead of controlling the RF BIST procedure from the IC, the BIST controller 6400 oversees all RF BIST operations occurring in the IC 60 by an IC control signal $S_{ctrl\_IC}$, and controls RF BIST operations in the testing module board by a module control signal $S_{ctrl\_mod}$. Upon receiving the command signal $S_{cmd}$, through the IC control signal $S_{ctrl\_IC}$, the BIST controller 6400 controls the signal generator 3000A to produce a test pattern $S_t$ for a corresponding RF BIST for the transmitter path or the loopback path and enables the test pattern $S_t$ to pass through the RF transmitter 3002A and output an RF output signal $S_{RF\_out}$ to the testing module board 64. The BIST controller 6400 also controls the circuit blocks in the testing module board to perform relevant RF BIST operations. In the embodiment, using the module control signal $S_{ctrl\_mod}$, the BIST controller 6400 enables the attenuator 3406 to change power level of the received RF output signal $S_{RF\_out}$, or controls the switch 3408 to switch between the signal evaluator 3410 for performing power detection test and/or the loopback path to the IC 60 for performing the BIST for the receiver path of the receiver 302. The BIST controller 6400 may further control the test analyzer 306 in the IC 60 via the IC control signal $S_{ctrl\_IC}$ to perform test analysis on RF BIST using the first evaluation signal $S_{ev1}$ from the testing module board 64, or using the second evaluation signal $S_{ev2}$ from the receiver 302. Followed by the test analysis, the test analyzer 306 may direct the test result $S_{dout}$ back to the ATE 62 and proceed for the next test.

Figure 7:
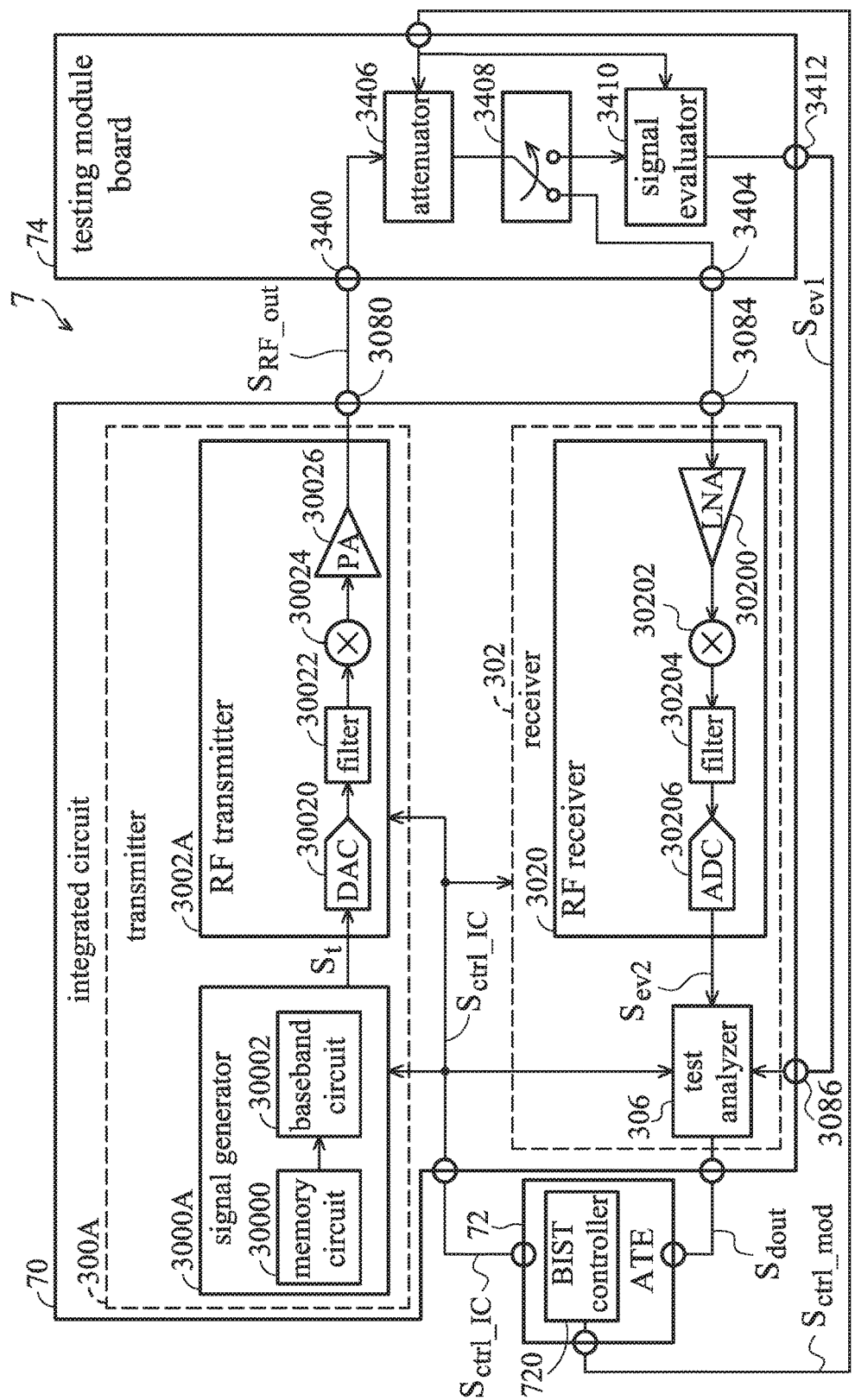
FIG. 7 is a block diagram of an RF BIST system 7 according to yet another embodiment of the invention.

FIG. 7 is a block diagram of an RF BIST system 7 according to yet another embodiment of the invention, comprising an integrated circuit 70, an ATE 72, and a testing module board 74. The testing module board 74 identical to the testing module board 34 FIG. 3, reference therefor is detailed in the preceding paragraphs. The circuit configuration and connection is identical to that in the RF BIST system 3, except that in the RF BIST system 7, a BIST controller 720 is provided at the ATE 72. In the embodiment, the IC 70 and the testing module board 74 receive test controls from the ATE 72, thus no command signal $S_{cmd}$ is required to initiate an RF BIST. The BIST controller 720 manages all RF BIST operations in the IC 70 by an IC control signal $S_{ctrl\_IC}$, and controls all RF BIST operations in the testing module board 74 by a module control signal $S_{ctrl\_mod}$. Through the IC control signal $S_{ctrl\_IC}$, the BIST controller 720 controls the signal generator 3000A to produce a test pattern $S_t$ for a corresponding RF BIST for the transmitter path or the loopback path and enables the test pattern $S_t$ to pass through the RF transmitter 3002A and output an RF output signal $S_{RF\_out}$ to the testing module board 74. Through the module control signal $S_{ctrl\_mod}$, the BIST controller 720 controls the attenuator 3406 to change power level of the received RF output signal $S_{RF\_out}$, or controls the switch 3408 to switch between the signal evaluator 3410 for performing power detection test and/or the loopback path to the IC 70 for performing the BIST for the receiver path of the receiver 302. The BIST controller 720 may further control the test analyzer 306 in the IC 70 via the IC control signal $S_{ctrl\_IC}$ to perform test analysis on RF BIST using the first evaluation signal $S_{ev1}$ from the testing module board 74, or the second evaluation signal $S_{ev2}$ from the receiver 302. Followed by the test analysis, the test analyzer 306 may report the test result $S_{dout}$ back to the ATE 62 and proceed for the next test.

Figure 8:
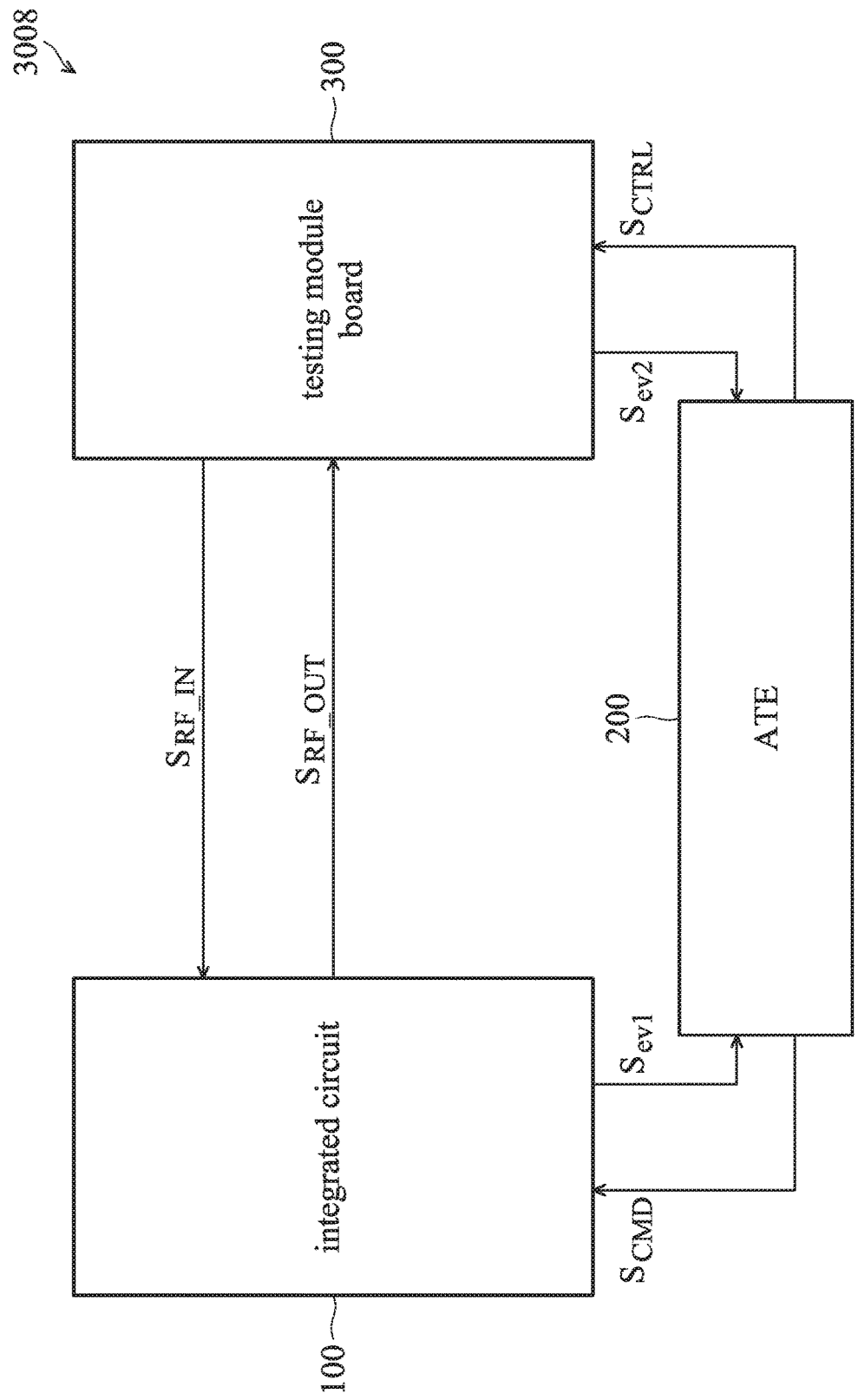
FIG. 8 is a simplified schematic block diagram of an RF testing system 3008 according to an embodiment of the invention.

FIG. 8 is a simplified schematic block diagram of an RF testing system 3008 according to an embodiment of the invention. As illustrated in FIG. 8, the RF testing system 3008 may comprise an IC 100, ATE 200, and a testing module board (e.g. a module circuitry) 300. The ATE 200 initializes a test process by sending a command signal $S_{CMD}$ to the IC 100. In response, the IC 100 is arranged to enter into a test mode, and, in contrast to the ATE 200 controlling the test process in the conventional approach, the IC 100 takes control of the test operations. However, this is for illustrative purpose rather than a limitation of the present invention. In other embodiments (which will be illustrated later), the test process control may take place in the testing module board 300, where the ATE 200 send the command signal $S_{CMD}$ to the testing module board 300, and the testing module board 300 then sends a control signal to the IC 100 accordingly. Or, the ATE 200 may be equipped with the test process controlling. Moreover, the test process aims to locate defective build elements in mixed-mode circuitry or analog circuitry in the IC 100. Under the test mode, the IC 100 communicates with the testing module board 300 using RF signals or analog signals. For example, the IC 100 may transmit the RF signals $S_{RF\_OUT}$ to the testing module board 300 for transmission-performance evaluation or receive RF signals $S_{RF\_IN}$ from the testing module board 300, which is generated by the testing module board 300 itself or the IC 100 itself and passing through the testing module board 300 using an external loopback path, to evaluate the reception performance of the IC 100 (details will be described later). The output signals $S_{ev1}$ may be an evaluation signal which is low-frequency (e.g., baseband, close to zero) produced and sent by the IC 100 to the ATE 200 for a test analysis. Similarly, the output signals $S_{ev2}$ may be an evaluation signal which is low-frequency (e.g., baseband, close to zero) produced and sent by the testing module board 300 to the ATE 200 for a test analysis. The testing module board 300, which is external to the IC 100 and ATE 200, comprises discrete components to assist signal property analysis as well as RF testing signal generation and receive a control signal $S_{CTRL}$ from the ATE 200 in the test mode. In this way, the ATE 200 does not need to process high-frequency (e.g. radio frequency) signals, and therefore the cost can be reduced. As the test analysis is performed by the ATE 200, the DUT is not necessarily equipped with a digital signal processor, that is, the IC 100 can be a system-on-chip (SOC) circuit or a stand-alone RF IC. In the following sections, different test configurations will be described.

Figure 9:
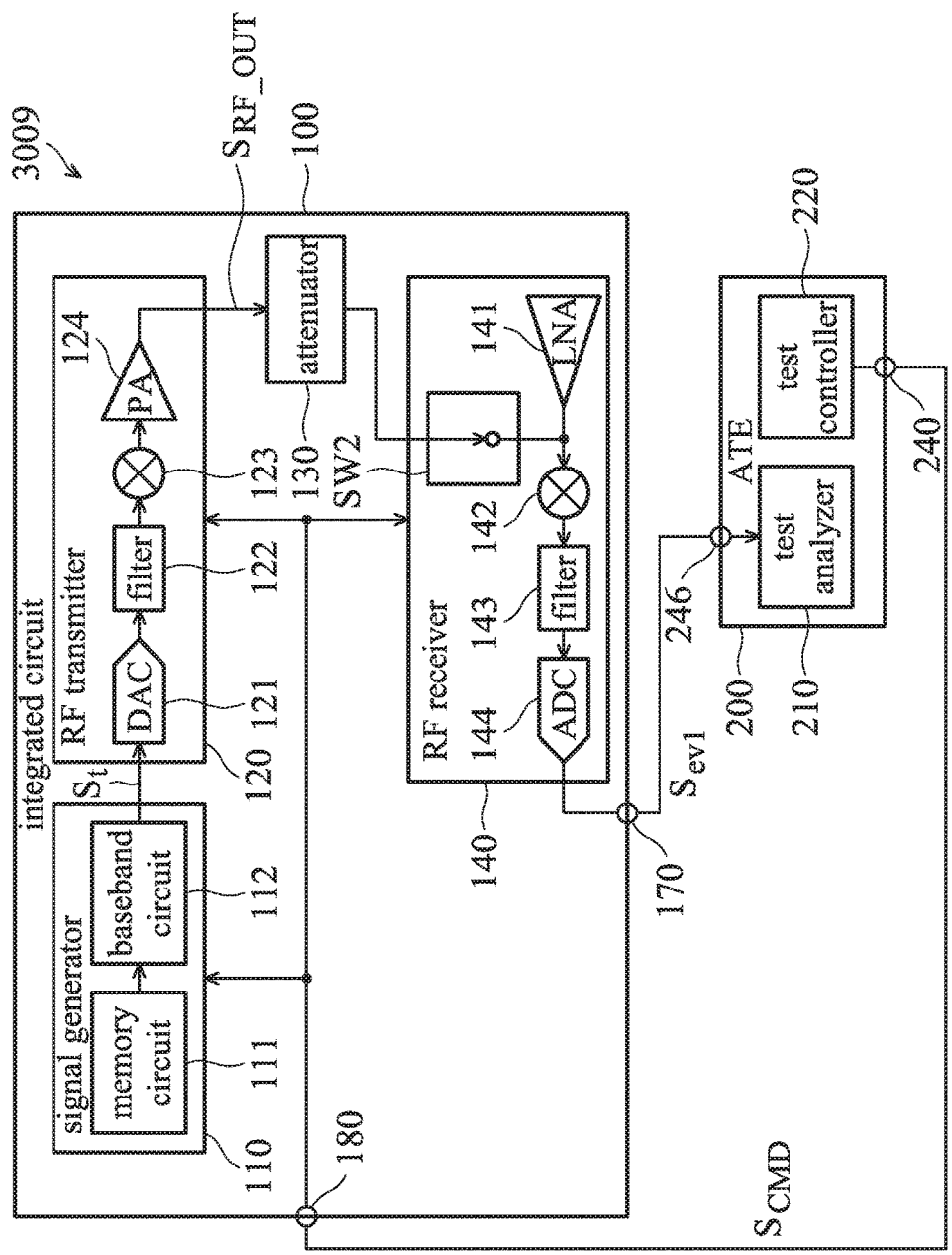
FIG. 9 is a detailed schematic block diagram of an RF testing system 3009 according to an embodiment of the invention.

FIG. 9 is a detailed schematic block diagram of the RF testing system 3009 according to an embodiment of the invention. The RF testing system 3009 may comprise an IC 100 and ATE 200. For example, the IC 100 may be a system-on-chip (SOC) or a stand-alone RF IC having digital-to-analog converters (DAC) and analog-to-digital converters (ADC). As illustrated in FIG. 9, the IC 100 comprises a signal generator 110, an RF transmitter 120, an attenuator 130, an RF receiver 140, and communication ports 170, 180. The RF transmitter 120 and the RF receiver 140 may belong to the same or different transceiver systems. For examples, the transmitter 120 and the receiver 140 may both belong to a WLAN system, or they may respectively belong to a WLAN system and a Bluetooth system. In some implementations, the signal generator 110 comprises a memory circuit 111 that keeps various test patterns for the RF test process therein, and a baseband circuit 112 that performs digital power control (not shown) and/or digital compensations (not shown) such as in-phase/quadrature (IQ) mismatch and digital pre-distortion. The RF transmitter 120 comprises a DAC 121, a filter circuit 122, a modulator 123, and a power amplifier (PA) 124. Similarly, the RF receiver 140 comprises a demodulator 142, a filter 143, and an ADC 144. The modulator 123 and demodulator 142 may further receive carrier signals from one or more local oscillators (not shown) to modulate and demodulate the outgoing and incoming RF signals, respectively. In this internal loopback configuration, the communication port 170 outputs an evaluation signal $S_{ev1}$ generated by the RF receiver 140 to the ATE 200.

As illustrated in FIG. 9, the ATE 200 may comprise a test analyzer 210, a test controller 220, and communication ports 240, 246. The test controller 220 of the ATE 200 directs the command signal $S_{CMD}$ through the communication ports 240 and 180 to components of the IC 100, thereby controlling components of the IC 100 to perform the RF test process. In response, the IC 100 enters a test mode and generates a test pattern signal $S_t$ internally. The test pattern $S_t$ is sent to the RF transmitter 120 to undergo various analog circuits passing in the transmitter path, rendering an outgoing RF signal $S_{RF\_OUT}$, which is further sent to the RF receiver 140 through the internal attenuator 130. The test analyzer 210 can be used to measure power at frequency associated with wanted tone, image tone or second-order or third-order harmonics to test transmitter/receiver gain, image rejection ratio (IRR), input second intercept point (IIP2), input third intercept point (IIP3), etc. In the test analyzer 210, we can implement a noise-power estimator to calculate noise power or signal-to-noise ratio (SNR) of the receiver for the NF test. The lock-time measure can also be implemented by software or hardware in the test analyzer 210 to test the lock time of a phase-locked loop (PLL), which comprises the instantaneous frequency estimation, lock-time calculation using the information of the frequency estimates, and pass/fail decision. Some estimators of modulated tests such as error vector magnitude (EVM) and spectrum estimators can also be implemented in the test analyzer 210 to evaluate the quality of the RF transmitter 120.

Specifically, in the internal loopback configuration, the outgoing RF signal $S_{RF\_OUT}$ is transferred to the demodulator 142 of the RF receiver 140 through the attenuator 130 to undergo RF impairments in a receiver path, outputting a first baseband evaluation signal $S_{ev1}$ through the communication port 170 to the test analyzer 210 of the ATE 200 for test analysis.

Figure 10:
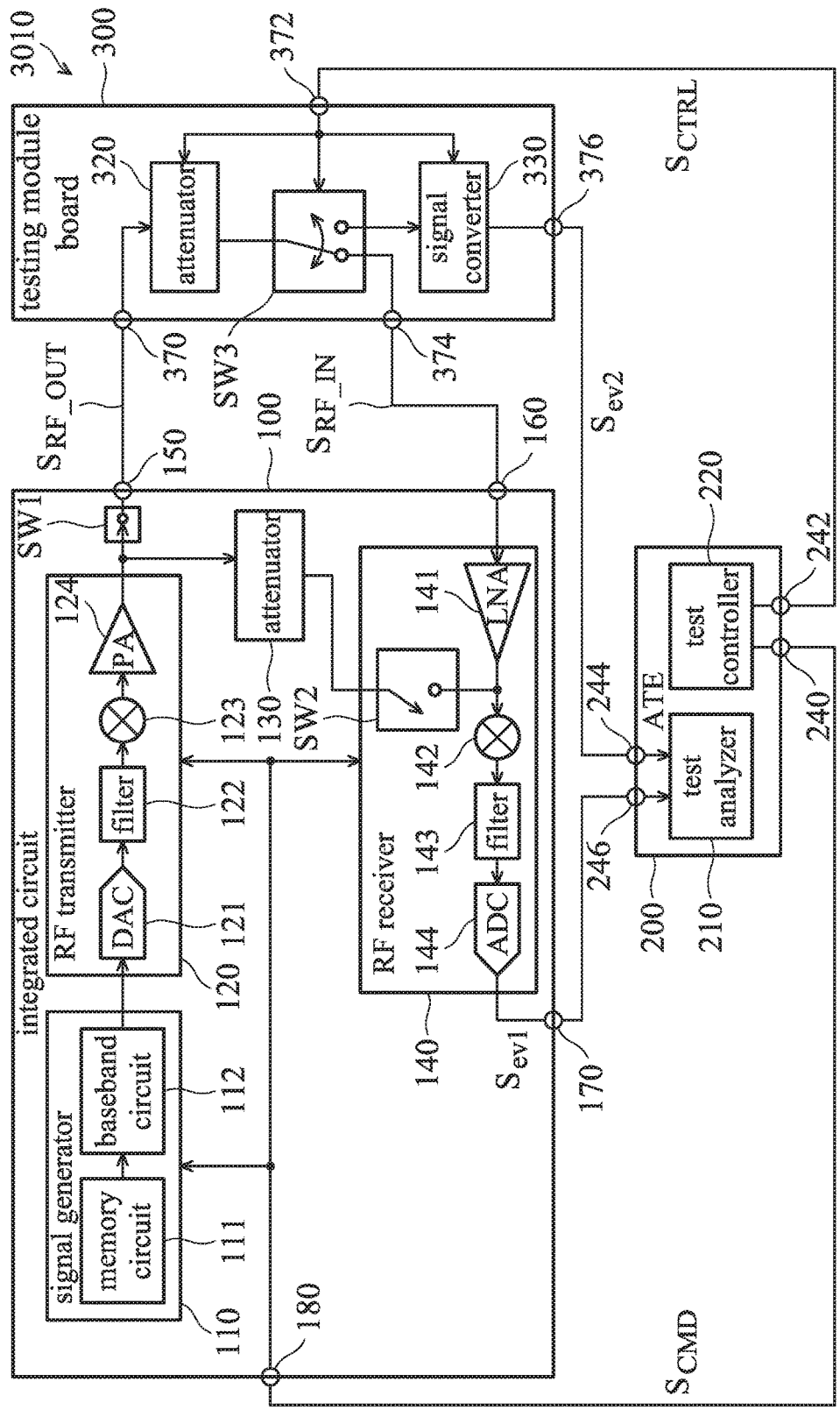
FIG. 10 is a detailed schematic block diagram of the RF testing system 3010 according to another embodiment of the invention.

FIG. 10 is a detailed schematic block diagram of the RF testing system 3010 according to another embodiment of the invention. The circuit configuration is similar to that in FIG. 9 except that the testing module board 300 is connected to the IC 100 and a low noise amplifier (LNA) 141 and switches SW1, SW2 are involved. The input of the demodulator 142 can be from the internal attenuator 130 or from the LNA 141 when the internal loopback path or the external loopback path is selected, respectively (details will be described later). When the internal loop-back path is selected (corresponding to FIG. 3), the switch SW1 is opened and the switch SW2 is closed, so that the outgoing RF signal $S_{RF\_OUT}$ is looped back through the internal attenuator 130 between the output of the RF transmitter 120 and the input of the RF receiver 140, such that the signal performance of the RF transmitter 120 and RF receiver 140 can be evaluated without the use of the external testing module board 300. In the embodiment of FIG. 10, the external loopback configuration is selected. In response, the switch SW1 is closed and the switch SW2 is opened. In addition, the test controller 220 of the ATE 200 further directs the control signal $S_{CTRL}$ through the communication ports 242, 372 to control the testing module board 300, and the communication port 160 of the IC 100 acquires the incoming RF signal $S_{RF\_IN}$ from the testing module board 300.

As illustrated in FIG. 10, the testing module board 300, which is external to the IC 100 and the ATE 200, may comprise an input port 370, a loopback port 374, a control port 372, an output port 376, an adjustable attenuator 320, a switch SW3, and a signal converter 330. In some implementations, a testing load board (not shown) is provided to hold the testing module board 300 and the IC 100 together. The testing load board may comprise an IC socket (not shown) to accept the IC 100 and a module slot (not shown) to hold the testing module board 300 in place during the test. The input port 370 accepts the response RF signal $S_{RF\_OUT}$ from the IC 100. The control port 372 receives the control signal $S_{CTRL}$ from the test controller 220 of the ATE 200 to enable the testing module board 300 to work under the test mode. The control signal $S_{CTRL}$ controls the attenuator 320 and switching of the switch SW3. Specifically, the attenuator 320 receives controls via the control signal $S_{CTRL}$ to adjust the attenuation level to the RF signal $S_{RF\_OUT}$. The switch SW3 is selected by the control signal $S_{CTRL}$ to switch between the signal converter configuration (i.e. through the signal converter 330) and the external loopback configuration (i.e. through the loopback port 374). In the external loopback configuration, the switch SW3 is switched to the loopback port 374, the outgoing RF signal $S_{RF\_OUT}$ from the RF transmitter 120 is attenuated by the attenuator 320 of the testing module board 300, and then output to the LNA 141 of the RF receiver 140 through the loopback port 374 to undergo RF impairments in a receiver path. In other words, the RF transmitter output signal $S_{RF\_OUT}$ is looped back through the attenuator 320 as an input RF signal $S_{RF\_IN}$ to the RF receiver 140 for a further test in the receiver path. In the RF receiver 140, the input RF signal $S_{RF\_IN}$ is down-converted into the baseband, which is digitized into digital words regarded as the evaluation signal $S_{ev1}$ sent to the test analyzer 210 of the ATE 200 for test analysis.

Figure 11A:
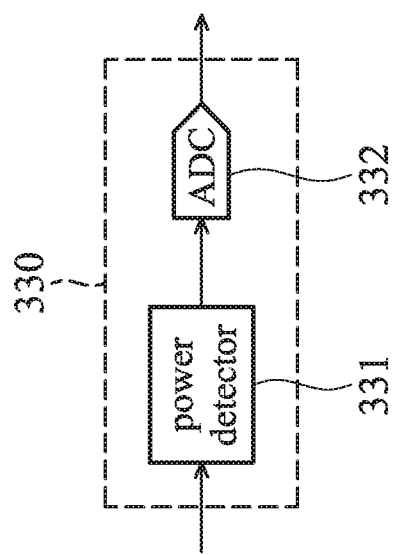
FIGS. 11A-11B are schematic block diagrams of the signal converter 330 according to different embodiments of the invention.
Figure 11B:
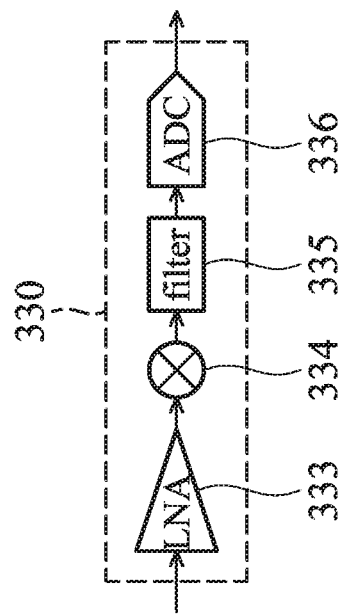
Figure 12:
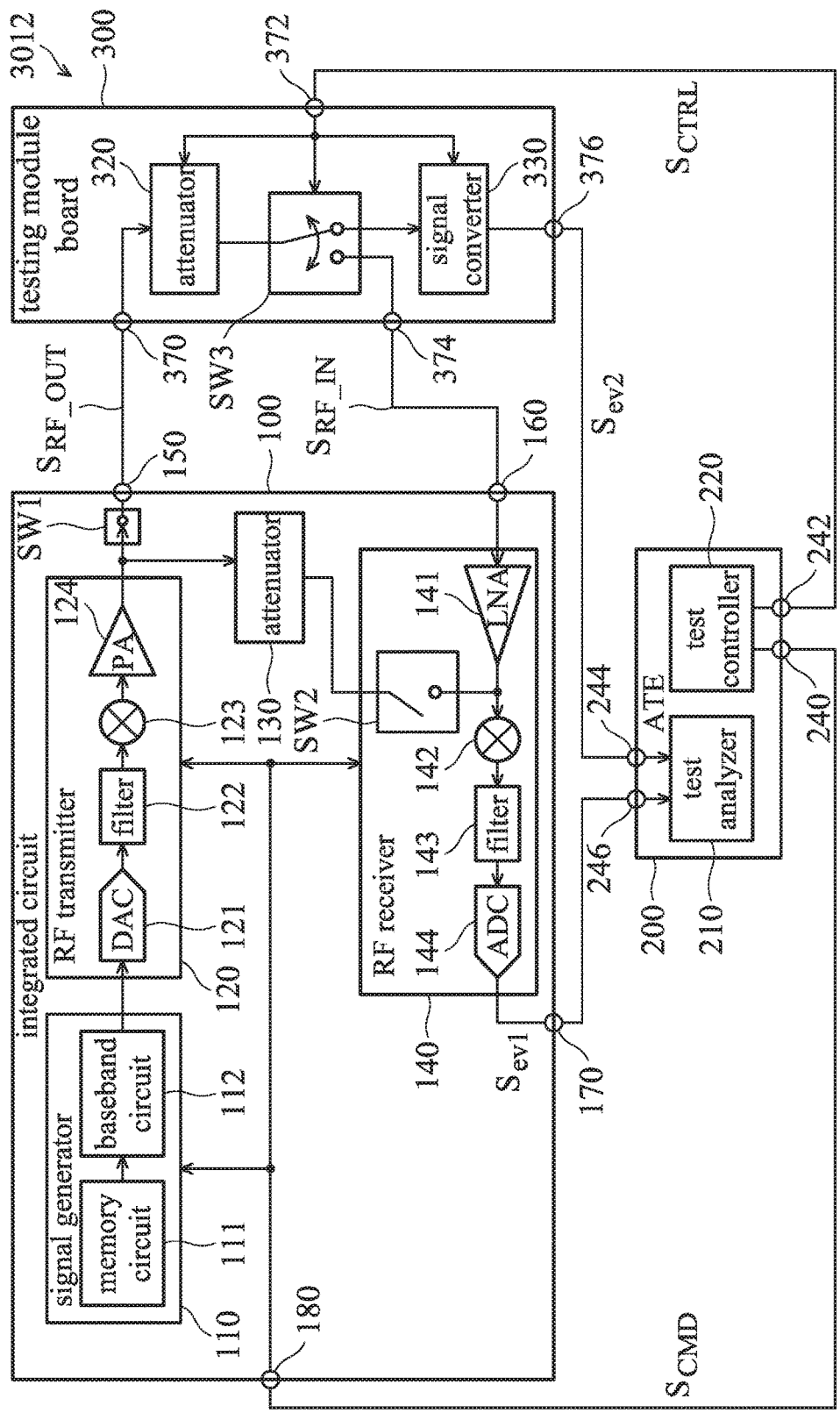
FIG. 12 is a detailed schematic block diagram of the RF testing system 3012 according to yet another embodiment of the invention.

In the signal converter configuration, as shown in FIG. 12, the switch SW3 is switched to the signal converter 330, the outgoing RF signal $S_{RF\_OUT}$ from the RF transmitter 120 is attenuated by the attenuator 320 of the testing module board 300, and then converted by the signal converter 330. In other words, the RF transmitter output signal $S_{RF\_OUT}$ is not looped back to the IC 100, but processed by the testing module board 300 to generate the evaluation signal $S_{ev2}$ sent to the test analyzer 210 of the ATE 200 through ports 374 and 244 for test analysis. FIGS. 11A-11B are schematic block diagrams of the signal converter 330 according to different embodiments of the invention. The signal converter 330 may be implemented in different circuits, thereby converting RF signals into analog/digital signals. For example, the signal converter 330 may comprise a power detector 331 and an ADC 332, as illustrated in FIG. 11A. Alternatively, the signal converter 330 may have similar components, such as an LNA 333, a demodulator 334, a filter 335, and an ADC 336, as those in the RF receiver 140, as illustrated in FIG. 11B. It should be noted that the invention is not limited to the aforementioned implementations of the signal converter 330. For those skilled in the art, it is appreciated that a reference RF receiver can be implemented in various circuits, and the details will not be described here.

It should be noted that the evaluation signals $S_{ev1}$ and $S_{ev2}$ may be in analog or digital form. In some implementations, the RF transmitter 120 and the RF receiver 140 do not have DAC/ADC circuits, and the test analyzer 210 may further comprise a digitizer (not shown) to convert the incoming analog evaluation signals into digital signals, thereby performing digital signal analysis of the RF test process.

In comparison to conventional RF test mechanisms, the present embodiment depicts an RF testing system where signal received/transmitted by the ATE 200 is only low-frequency signals. Only low-frequency command signal $S_{CMD}$ and evaluation signals $S_{ev1}$ are exchanged between the IC 100 and the ATE 200. In addition, only low-frequency control signal $S_{CTRL}$ and evaluation signals $S_{ev2}$ are exchanged between the testing module board 300 and the ATE 200. It should be noted that high-speed communication is only between the IC 100 and the testing module board 300. This leads to a reduction in the circuit complexity of the ATE 200, thereby decreasing design and manufacturing cost.

In view of the above, three configurations, which are the internal loopback configuration, the external loopback configuration, and the signal converter configuration, are provided to test the transmission performance of the IC 100. Upon receiving the evaluation signal $S_{ev1}$ or $S_{ev2}$, a test analysis of the transmission performance of the IC 100 can be performed by the test analyzer 210 of the ATE 200. For example, the transmitter path is usually tested at the system level test by the EVM and spectrum, nonlinearity tests such as IIP2 and IIP3, an image signal test, a carrier leakage test, and a transmission power test.

Figure 13:
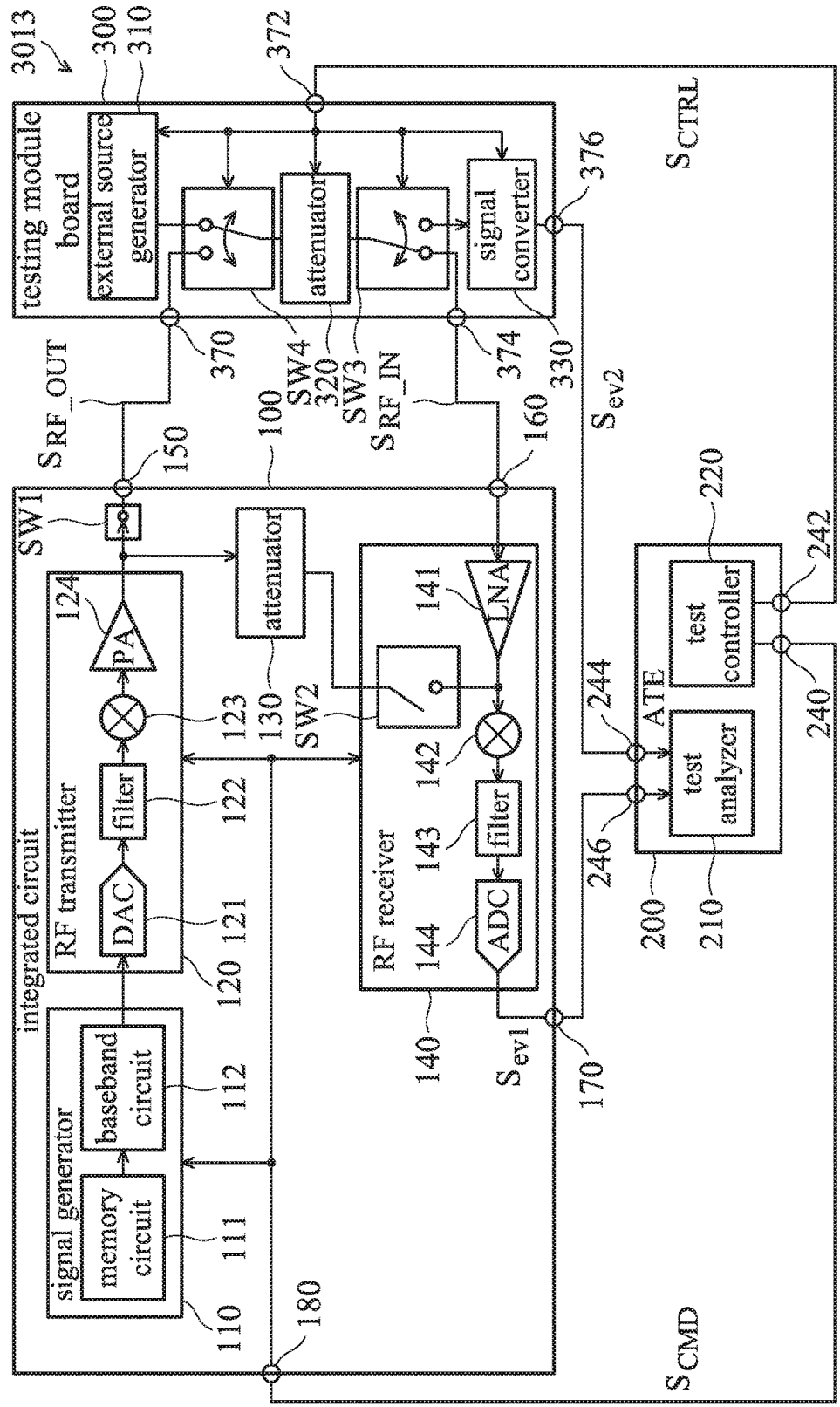
FIG. 13 is a detailed schematic block diagram of the RF testing system 3013 according to still yet another embodiment of the invention.

FIG. 13 is a detailed schematic block diagram of the RF testing system 3013 according to still yet another embodiment of the invention. The circuit configuration and connection is similar to those in the RF testing system 3012, except that in the RF testing system 3013, an external source generator 310 and a switch SW4 are placed at the testing module board 300 for further performing Rx test process. The switch SW4 is controlled by the control signal $S_{CTRL}$ to switch between the incoming RF signals from the RF transmitter 120 or from the external source generator 310. Specifically, referring to FIG. 13, upon receiving the control signal $S_{CTRL}$ indicating initiation of an RF Rx test process, the external source generator 310 may start to generate the single-tone, two-tone, and modulation signals required in the RF Rx test process. Meanwhile, the switch SW4 is switched to the external source generator 310 and the switch SW3 is switched to the communication port 374. In response, the generated signals from the external source generator 310 are fed into the attenuator 320, and then the attenuated RF signals are transmitted to the LNA 141 of the RF receiver 140 via the communication port 374, thereby evaluating the reception performance of the IC 100 in the receiver path at the test analyzer 210. Similarly, the RF receiver 140 may output the first evaluation signal $S_{ev1}$ through the communication port 170 to the test analyzer 210 of the ATE 200 for test analysis. Upon receiving the evaluation signal $S_{ev1}$, a test analysis of the reception performance of the IC 100 can be performed by the test analyzer 210 of the ATE 200. For example, the evaluated characteristics for the receiver path comprise a receiver gain test, an image signal test, a DC offset test, an NF test, and nonlinearity tests such as IIP2 and IIP3.

Figure 14C:
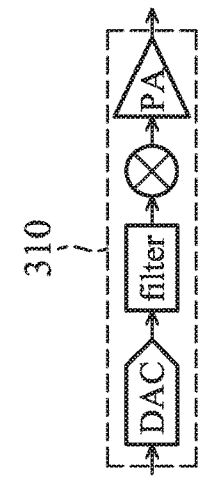
FIG. 14A-14C are block diagrams of the external source generator 310 according to different embodiments of the invention.
Figure 14B:
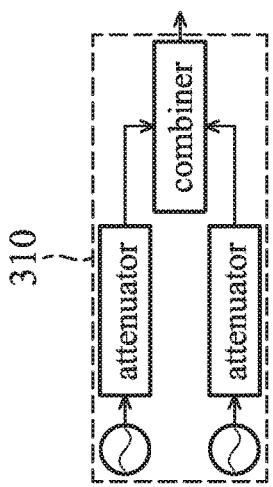
Figure 14A:
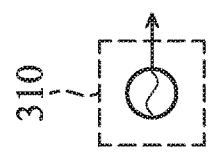

FIGS. 14A-14C are block diagrams of the external source generator 310 according to different embodiments of the invention. For example, the external source generator 310 may be a single-tone generator, a dual-tone generator, and/or a reference RF transmitter, as illustrated in FIGS. 14A, 14B and 14C, respectively. The DAC in FIG. 14C may be coupled to a test pattern generator not shown, or receive test pattern from the TE 200. Implementations of the signal-tone generator, dual-tone generator, and the reference RF transmitter are well-known to those skilled in the art, and the details will not be described here.

Figure 15:
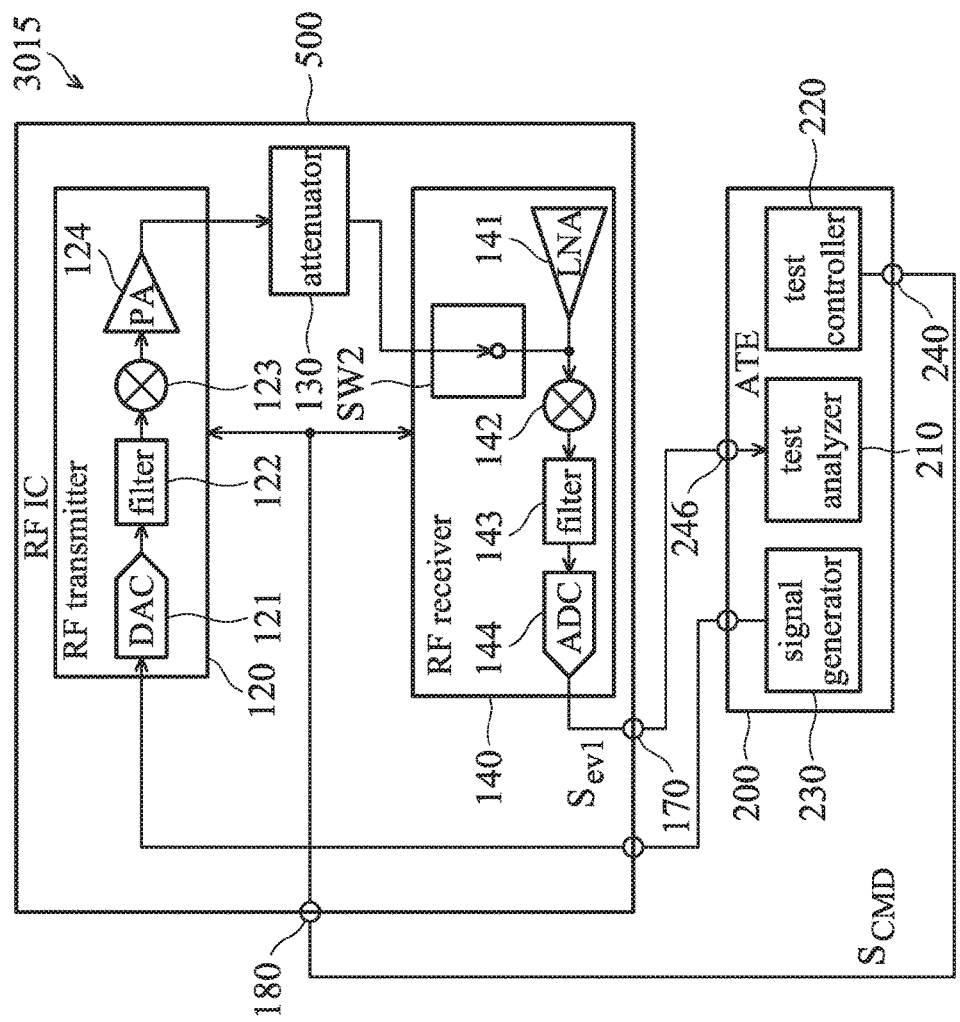
FIG. 15 is a schematic block diagram of an RF testing system 3015 according to an embodiment of the invention.

FIG. 15 is a schematic block diagram of an RF testing system 3015 according to an embodiment of the invention. In the RF testing system 3015, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3015 are similar to those in the RF testing system 3009, and the details can be referred to in the aforementioned embodiments of FIG. 9. Similar to the embodiment of FIG. 9, the internal loopback configuration is also selected in the RF testing system 3015. Specifically, the RF transmitter 120 receives the external RF test pattern signals from the signal generator 230 of the ATE 200. Then, the outgoing RF signal generated by the RF transmitter 120 may be internally fed back to the RF receiver 140 through the internal attenuator 130. In addition, the evaluation signal $S_{ev1}$ output by the RF receiver 140 can be fed into the test analyzer 210 for test analysis.

Figure 16:
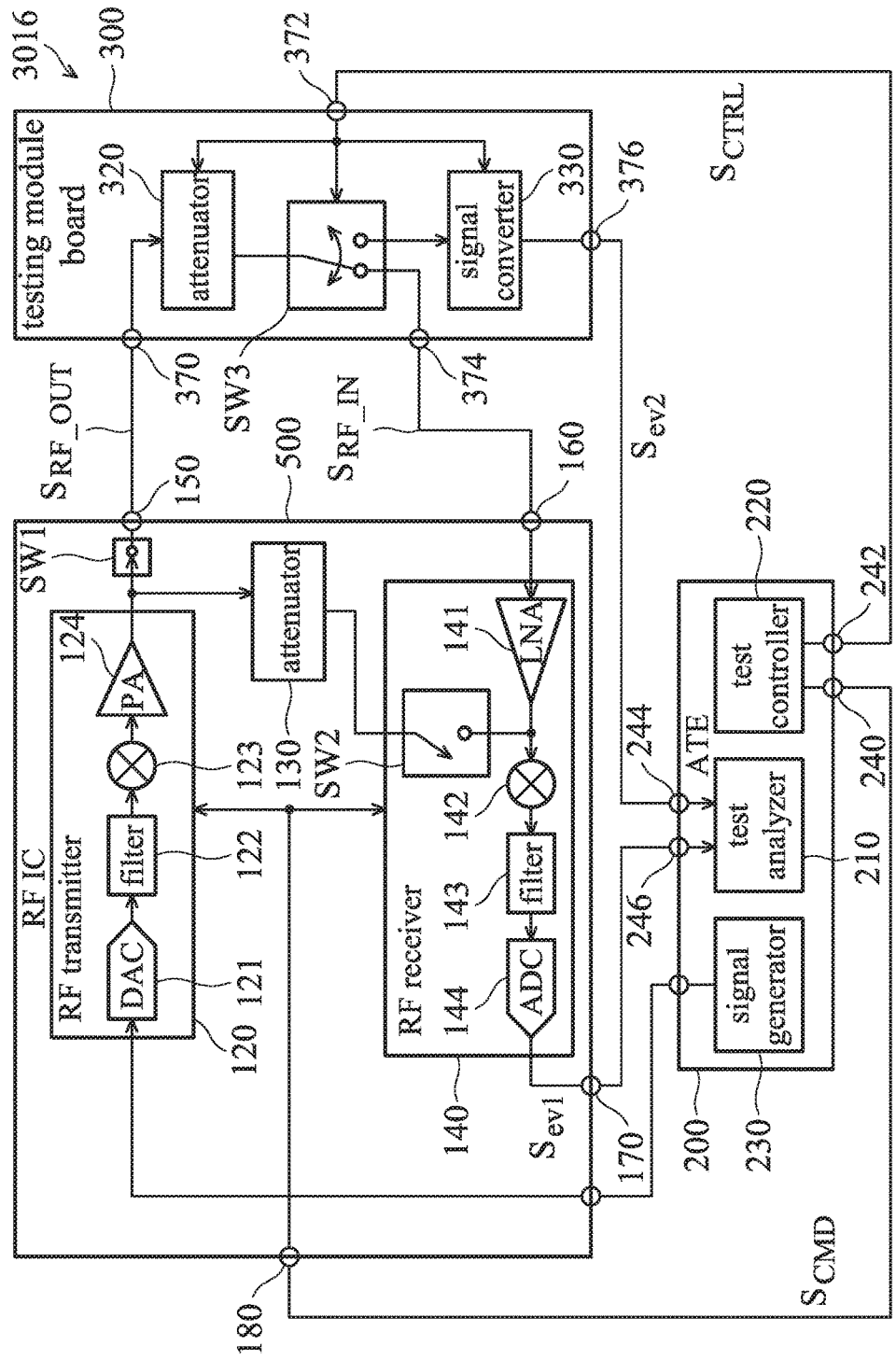
FIG. 16 is a schematic block diagram of an RF testing system 3016 according to another embodiment of the invention.

FIG. 16 is a schematic block diagram of an RF testing system 3016 according to another embodiment of the invention. In the RF testing system 3016, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3016 are similar to those in the RF testing system 3010, and the details can be referred to in the aforementioned embodiments of FIG. 10. Similar to the embodiment of FIG. 10, the external loopback configuration is also selected in the RF testing system 3016. Specifically, the RF transmitter 120 receives the external RF test pattern signals from the signal generator 230 of the ATE 200 and generates the outgoing RF test signal $S_{RF\_OUT}$. Then, the outgoing RF test signal $S_{RF\_OUT}$ from the RF transmitter 120 is transmitted to the testing module board 300. The RF test signal $S_{RF\_OUT}$ is attenuated by the attenuator 320 in the testing module board 300, and the attenuated RF test signal is further fed back into the RF receiver 140 through the communication port 160. Subsequently, the evaluation signal $S_{ev1}$ output by the RF receiver 140 can be fed into the test analyzer 210 for test analysis.

Figure 17:
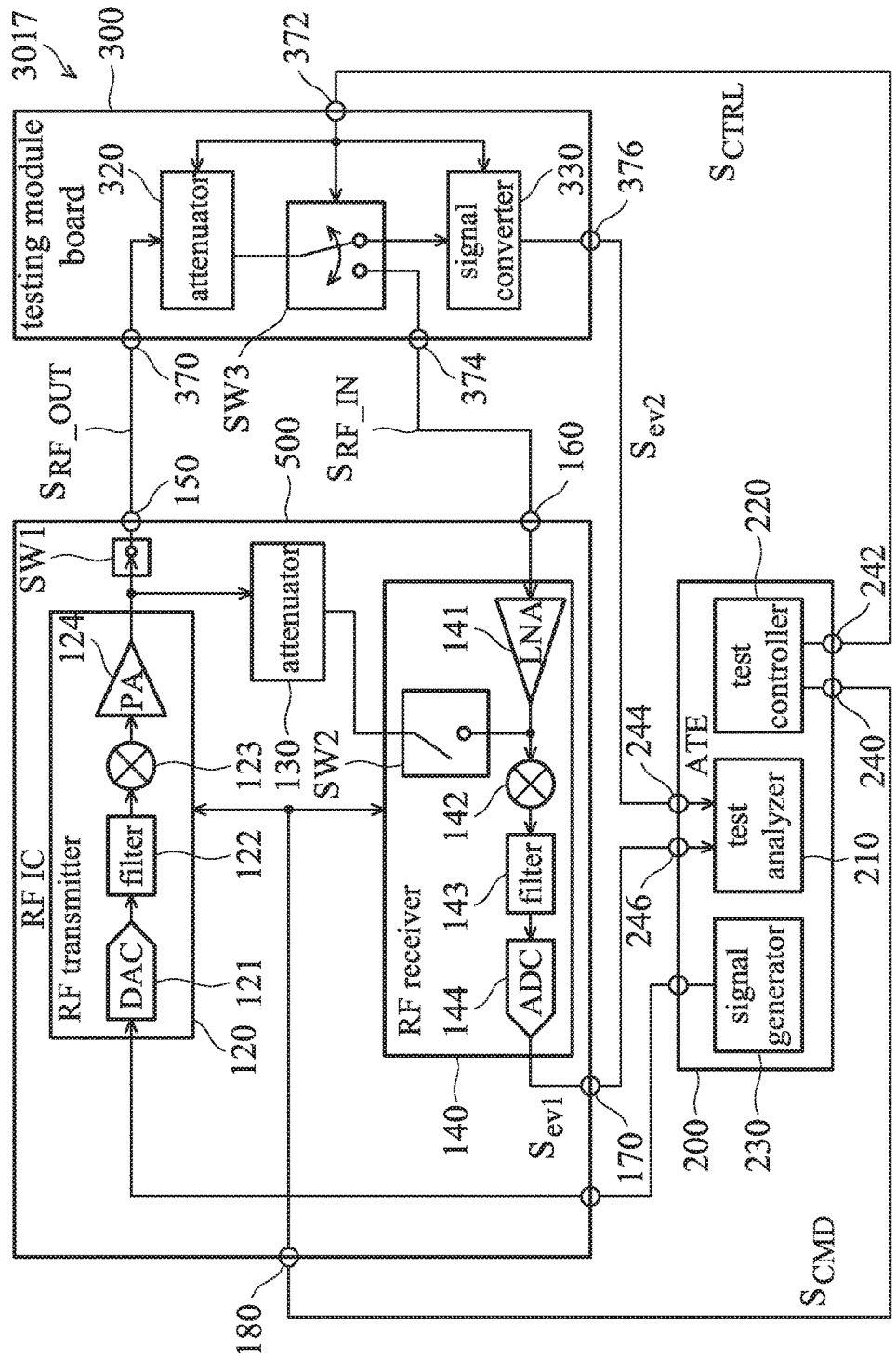
FIG. 17 is a schematic block diagram of an RF testing system 3017 according to yet another embodiment of the invention.

FIG. 17 is a schematic block diagram of an RF testing system 3017 according to yet another embodiment of the invention. In the RF testing system 3017, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3011 are similar to those in the RF testing system 3012, and the details can be referred to in the aforementioned embodiments of FIG. 12. Similar to the embodiment of FIG. 12, the signal converter configuration is also selected in the RF testing system 3017. Specifically, the RF transmitter 120 receives the external RF test pattern signals from the signal generator 230 of the ATE 200. Then, the outgoing RF test signal $S_{RF\_OUT}$ from the RF transmitter 120 is transmitted to the testing module board 300. The RF test signal $S_{RF\_OUT}$ is attenuated by the attenuator 320 in the testing module board 300, and the attenuated RF test signal is further fed into the signal converter 330 for signal conversion. Subsequently, a second evaluation signal $S_{ev2}$ is generated by the signal converter 330, and is further transmitted to the test analyzer 210 of the ATE 200 through the communication port 376.

Figure 18:
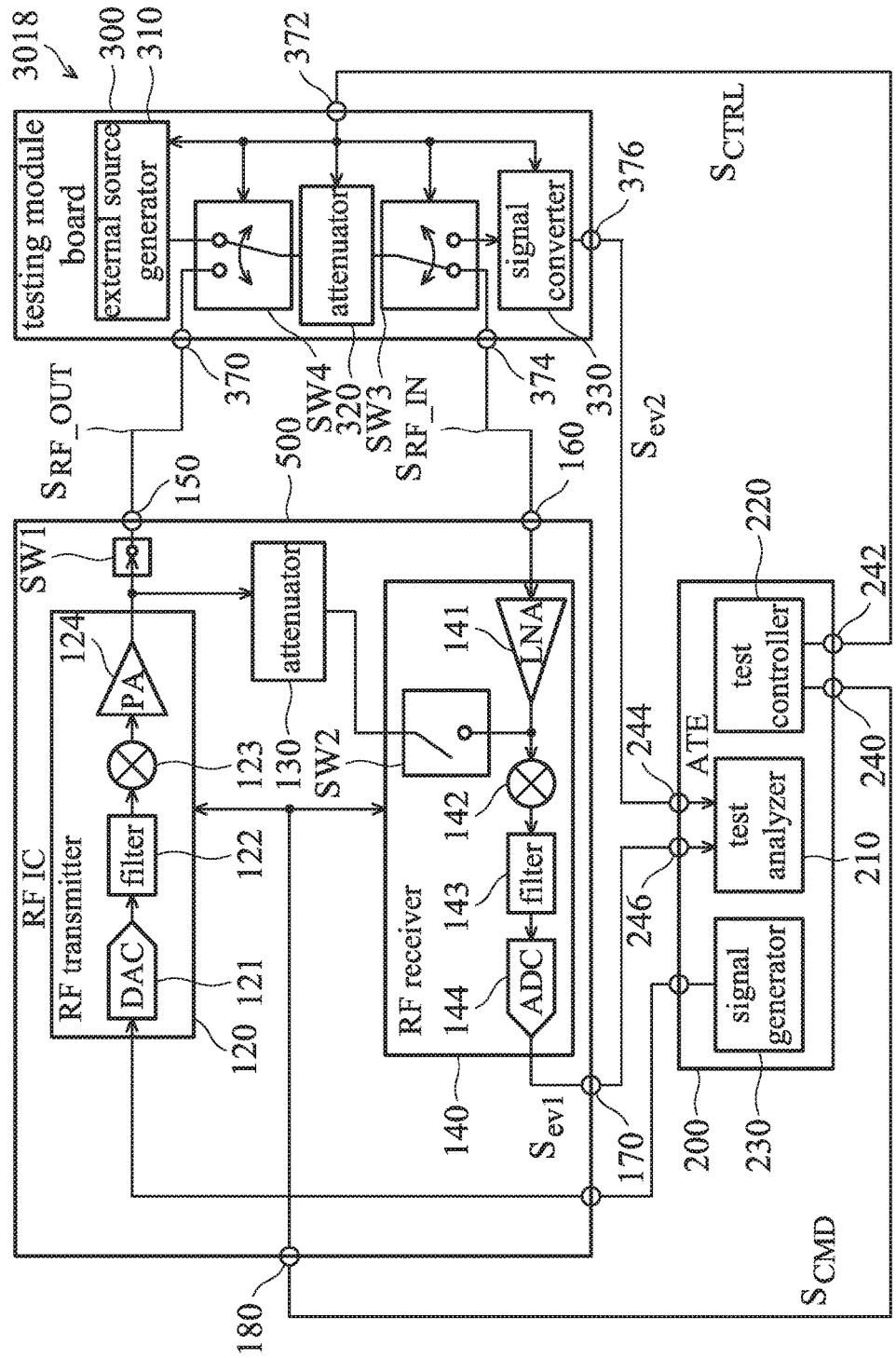
FIG. 18 is a schematic block diagram of an RF testing system 3018 according to still yet another embodiment of the invention.

FIG. 18 is a schematic block diagram of an RF testing system 3018 according to still yet another embodiment of the invention. In the RF testing system 3018, the IC 500 may be a stand-alone RF IC without a signal generator. The circuit configuration and connection of the components in the RF testing system 3018 are similar to those in the RF testing system 3013 except that the signal generator 230 has been moved to the ATE 200, and the details can be referred to in the aforementioned embodiments of FIG. 13. Similar to the RF testing system 3013, the testing module board 300 is controlled by the control signals $S_{CTRL}$ generated by the test controller 220 of the ATE 200. Specifically, upon receiving the control signal $S_{CTRL}$ indicating initiation of an RF Rx test process, the external source generator 310 may start to generate the single-tone, two-tone, and modulation signals required in the RF Rx test process. Meanwhile, the switch SW4 is switched to the external source generator 310 and the switch SW3 is switched to the communication port 374, so that the generated signals from the external source generator 310 may be fed into the attenuator 320, and then the attenuated RF signals can be transmitted to the LNA 141 of the RF receiver 140 via the communication port 374, thereby evaluating the reception performance of the IC 100 in the receiver path at the test analyzer 210. Similarly, the RF receiver 140 may output the first evaluation signal $S_{ev1}$ through the communication port 170 to the test analyzer 210 of the ATE 200 for test analysis. Upon receiving the evaluation signal $S_{ev1}$, a test analysis of the reception performance of the IC 100 can be performed by the test analyzer 210 of the ATE 200.

It should be noted that the evaluation signals $S_{ev1}$ and $S_{ev2}$ may be in analog or digital form. In some implementations, the above-mentioned RF transmitter and RF receiver do not have DAC/ADC circuits, and the test analyzer 210 may further comprise a digitizer (not shown) to convert the incoming analog evaluation signals into digital signals, thereby performing digital signal analysis of the RF test process.

Figure 19:
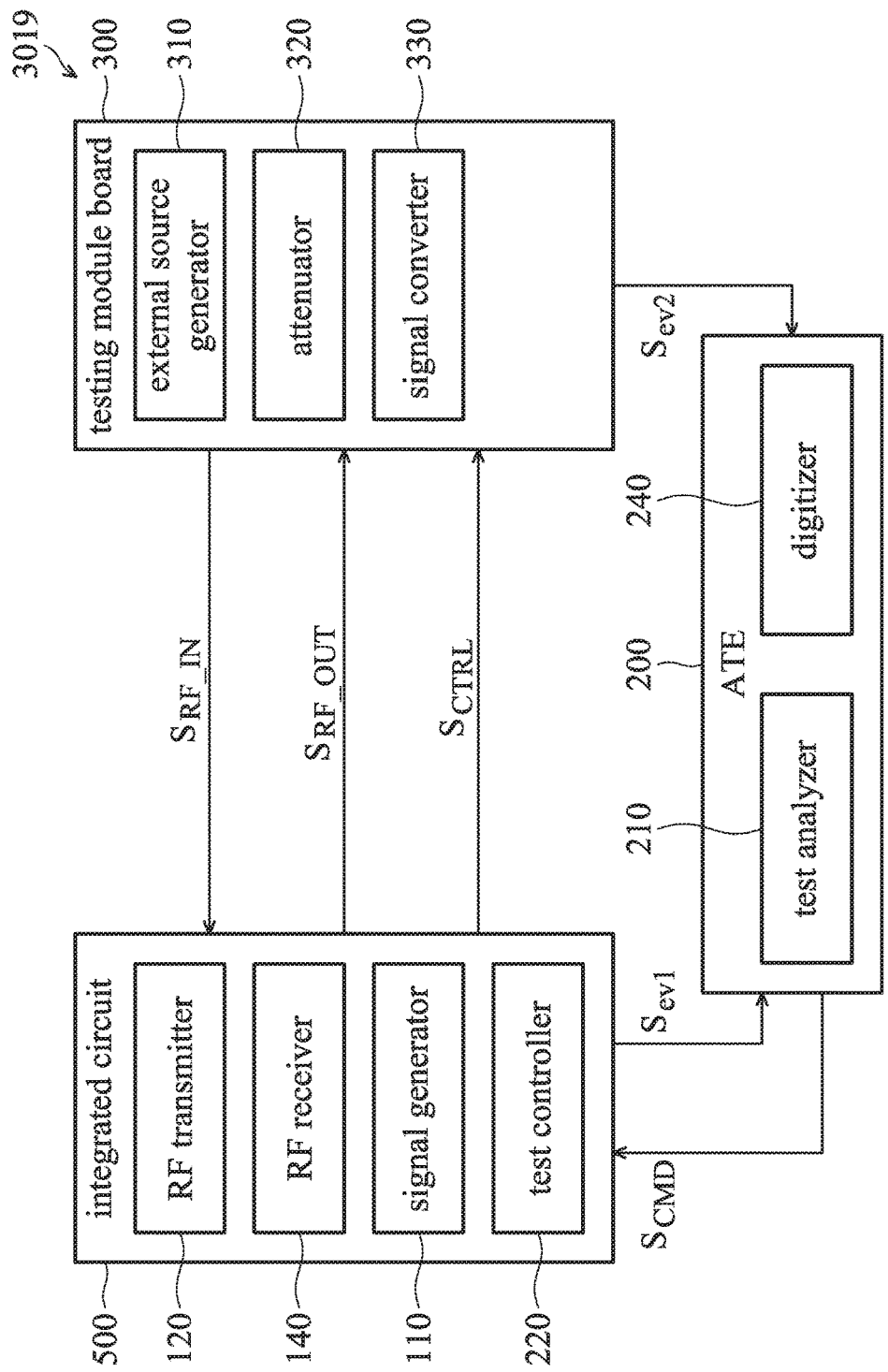
FIG. 19 is a schematic block diagram of an RF testing system 3019 according to still another embodiment of the invention.

FIG. 19 is a schematic block diagram of an RF testing system 3019 according to still another embodiment of the invention. In the RF testing system 3019, the IC 500 may be a SOC or a stand-alone RF IC having a test controller, and the circuit configuration and connection of the components in the RF testing system 3019 are similar to those in the RF testing system 3013 except that the test controller 220 has been moved to the IC 500. In the embodiment, the test analyzer 210 of the ATE 200 is capable of initiating an RF Tx or Rx test process by issuing a command signal (i.e. a digital signal) $S_{CMD}$ to the test controller 220 in the IC 500, and the test controller 220 in the IC 500 may send corresponding control signals $S_{CTRL}$ to the components in the IC 500 and the testing module board 300 in response to the command signal $S_{CMD}$. It should be noted that different RF test configurations, which are previously described in the embodiments of FIGS. 9 to 18, can be used in the RF testing system 3019, and the details can be referred to in the embodiment of FIGS. 9 to 18. Specifically, the test analyzer 210 of the ATE 200 is still responsible for receiving the evaluation signal (i.e. a low-speed analog/digital signal) from either the RF receiver 140 or the signal convertor 330 for digital signal analysis. When the evaluation signal from either the RF receiver 140 or the signal convertor 330 is in an analog form, the digitizer 240 of the ATE 200 may convert the evaluation signal into digital signals before the test analysis is performed by the test analyzer 210.

Figure 20:
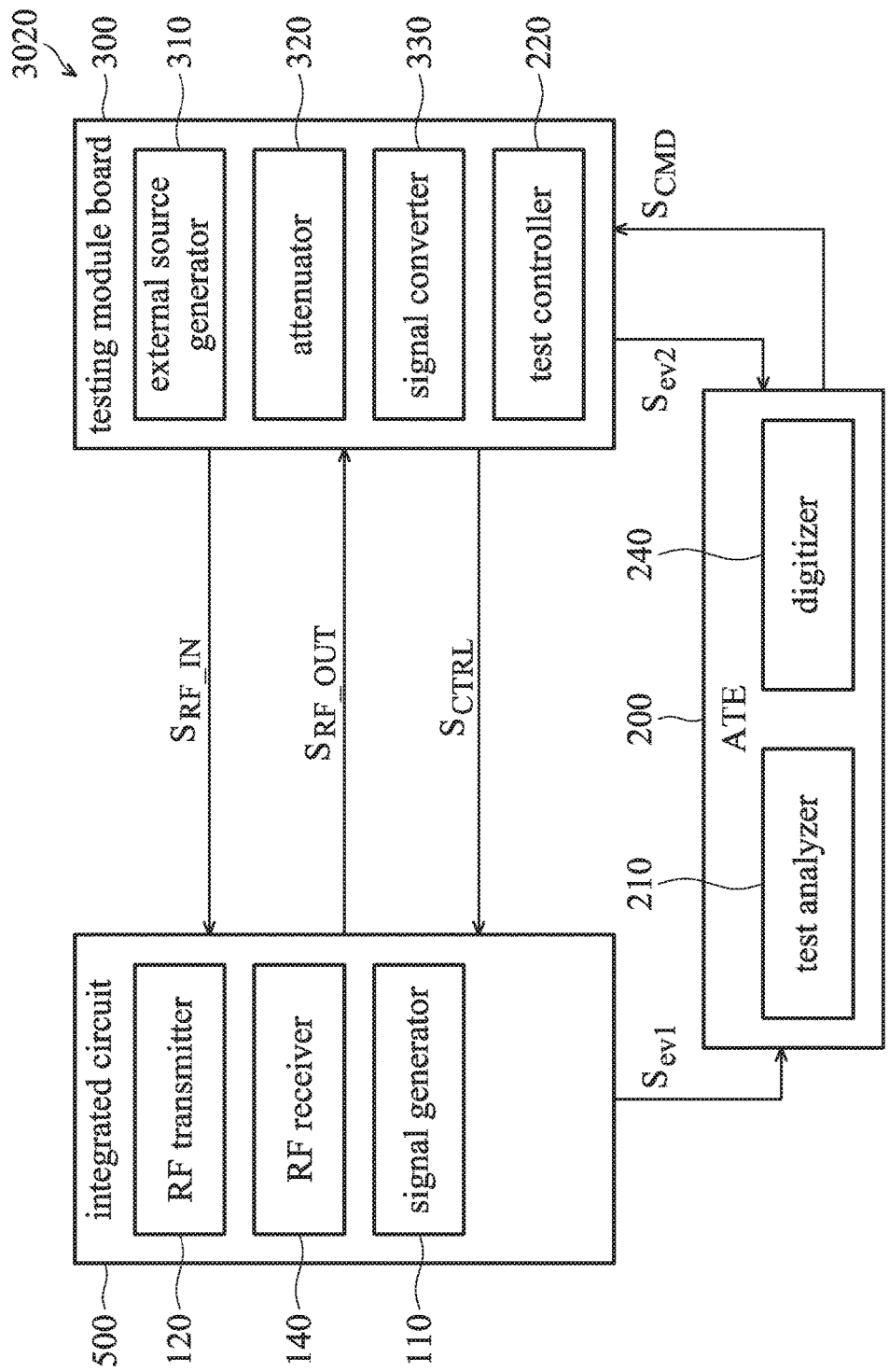
FIG. 20 is a schematic block diagram of an RF testing system 3020 according to still another embodiment of the invention.

FIG. 20 is a schematic block diagram of an RF testing system 3020 according to still another embodiment of the invention. In the RF testing system 3020, the IC 500 may be a SOC or a stand-alone RF IC, and the circuit configuration and connection of the components in the RF testing system 3020 are similar to those in the RF testing system 3013 except that the test controller 220 has been moved to the testing module board 300. In the embodiment, the ATE 200 is capable of initiating an RF Tx or Rx test process by issuing a command signal (i.e. a digital signal) $S_{CMD}$ to the test controller 220 in the testing module board 300, and the test controller 220 in the testing module board 300 may send the control signals $S_{CTRL}$ to the corresponding components in the IC 500 and the testing module board 300 in response to the command signal $S_{CMD}$. It should be noted that different RF test configurations, which are previously described in the embodiments of FIGS. 9 to 18, can be used in the RF testing system 3020, and the details can be referred to in the embodiment of FIGS. 9 to 18. Specifically, the test analyzer 210 of the ATE 200 is still responsible for receiving the evaluation signal (i.e. a low-speed analog/digital signal) from either the RF receiver 140 or the signal convertor 330 for digital signal analysis. When the evaluation signal from either the RF receiver 140 or the signal convertor 330 is in analog form, the digitizer 240 of the ATE 200 may convert the evaluation signal into digital signals before the test analysis is performed by the test analyzer 210.

Figure 21:
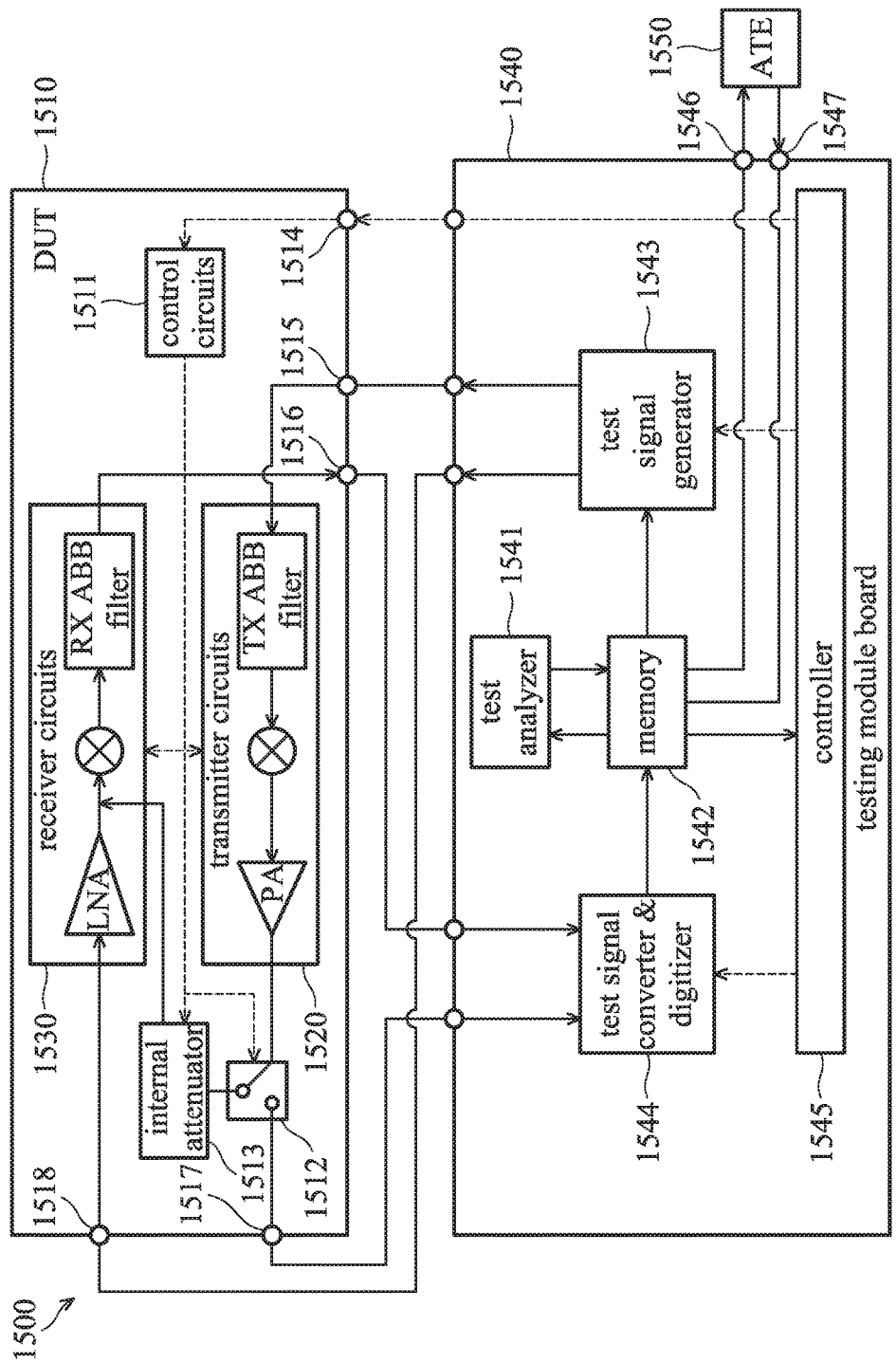
FIG. 21 is a diagram of an RF testing system in accordance with an embodiment of the invention.

FIG. 21 is a diagram of an RF testing system in accordance with an embodiment of the invention. The RF testing system 1500 includes a device under test (DUT) 1510, a testing module board 1540, and an ATE 1550. The DUT 1510 includes an RF transmitter 1520, an RF receiver 1530, a control circuit 1511, a switch 1512, and an internal attenuator 1513. More particularly, the DUT 1510 does not have a digital processing unit and may be a pure analog die.

The testing module board 1540 includes a test analyzer 1541, a memory 1542, a test signal generator 1543, a signal converter and digitizer 1544, and a controller 1545. The controller 1545 is configured to generate control signals for the components in the testing module board 1540. In addition, the controller 1545 may also send a control signal to the control circuit 1511 via digital control pins 1514 of the testing module board 1540 and the DUT 1510. For example, the controller 1545 can be implemented by an FPGA, a microcontroller, or a digital circuit. The memory 1542 is for storing test patterns, calibration results, and captured test data, etc. The test signal generator 1543 is configured to generate an RF or analog test signal such as one-tone, two-tone, and modulation signals. The signal converter and digitizer 1544 is configured to convert RF or analog test signals to digital test data, and store the digital test data in the memory 1542. The test analyzer 1541 is configured to analyze the test data and report the test results to the ATE 1550. It should be noted that the testing module board 1540 comprises off-the-shelf components such as an FPGA, an external source, a power detector, an ADC, a DAC, and an RF IC with signal up-conversion and down-conversion, etc.

The ATE 1550 is coupled to the memory 1542 of the testing module board 1540, and is configured to upload RF or analog test patterns to the memory 1542 and capture test data and read test results from the memory 1542.

In an embodiment, while performing an RF Rx test, the test signal generator 1543 may generate an RF test signal that is transmitted to the RF receiver 1530 according to the test pattern stored in the memory 1542. The RF receiver 1530 may down-convert and filter the RF test signal, and transmit the resulting signal to the converter and digitizer 1544 via analog Rx pins 1516 of the DUT 1510, so that the converter and digitizer 1544 may convert the resulting analog signal to digital Rx test data, and store the digital Rx test data in the memory 1542. The test analyzer 1541 may analyze the test data and report the test results to the ATE 1550, or the ATE 1550 may capture the test data and analyze it to generate the test results.

In an embodiment, while performing an RF Tx test, the test signal generator 1543 may generate an analog test signal and transmit the analog test signal to the RF transmitter 1520 via analog Tx pins 1515. The RF transmitter 1520 may filter, up-convert and amplify the analog test signal to generate an output RF signal. The output RF signal generated by the RF transmitter 1520 is fed to the RF receiver 1530 through the internal attenuator 1513 (i.e. the switch 1512 is connected to the internal attenuator 1513). The RF receiver 1530 then down-converts and filter the attenuated RF signal and generates a resulting analog signal, and transmits the resulting analog signal to the converter and digitizer 1544 via analog Rx pins 1516 of the DUT 1510, so that the converter and digitizer 1544 may convert the resulting analog signal to digital test data, and store the digital Tx test data in the memory 1542. The test analyzer 1541 may analyze the test data and report the test results to the ATE 1550, or the ATE 1550 may capture the test data and analyze it to generate the test results. Accordingly, an internal loopback path of the DUT 1510 can be tested.

Alternatively, while performing an RF Tx test, the test signal generator 1543 may generate an analog test signal and transmit the analog test signal to the RF transmitter 1520, and the output RF signal generated by the RF transmitter 1520 is transmitted to the converter and digitizer 1544 via RF Tx pins 1517 of the DUT 1510 (i.e. the switch 1512 is connected to the RF Tx pins 1517), so that the converter and digitizer 1544 may convert (down-convert and analog-to-digital convert) the output RF signal to digital test data, and store the digital test data in the memory 1542. The test analyzer 1541 may analyze the test data and report the test results to the ATE 1550, or the ATE 1550 may capture the test data and analyze it to generate the test results. Accordingly, the function of the RF transmitter 1520 can be tested individually.

In view of the above, the gain, DC value, image rejection ratio (IRR), input second intercept point (IIP2), input third intercept point (IIP3), lock time, sensitivity, etc. can be tested in the RF Rx tests. For example, the test analyzer 1541 can be used to measure power at a frequency associated with the desired tone, image tone, or intermodulation tone due to second-order or third-order harmonics to test transmitter/receiver gain, IRR, IIP2, IIP3, etc. A noise-power estimator can be implemented in the test analyzer 1541 to calculate noise power or signal-to-noise ratio (SNR) of the receiver for the NF test. The lock-time measure can also be implemented by software or hardware in the test analyzer 1541 to test the lock time of a phase-locked loop (PLL), which comprises the instantaneous frequency estimation, lock-time calculation using the information of the frequency estimates, and pass/fail decision. Some estimators of modulation tests such as error vector magnitude (EVM) and spectrum estimators can also be implemented in the test analyzer 1541 to evaluate the quality of the RF transmitter 1520.

In addition, the power consumption, ACLR, EVM, IRR, IIP3, carrier leakage, and/or spectrum of the RF transmitter 1520 can be tested in the RF Tx tests with higher test coverage. Furthermore, no additional embedded sensors are required in the DUT 1510. It should be noted that the ATE 1550 does not have any RF instruments.

Figure 22:
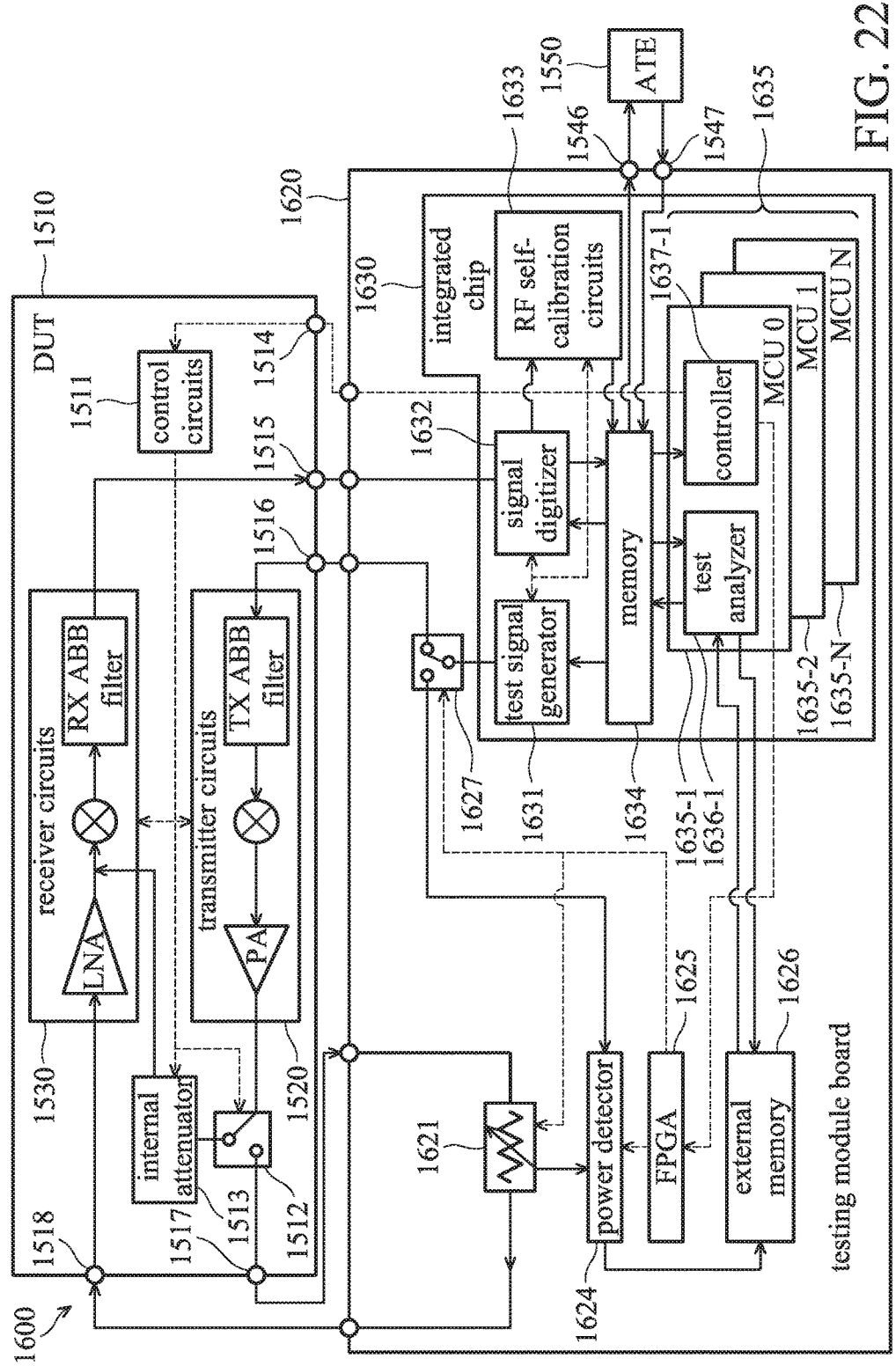
FIG. 22 is a diagram of an RF testing system in accordance with another embodiment of the invention.

FIG. 22 is a diagram of an RF testing system in accordance with another embodiment of the invention. The RF testing system 1600 includes a DUT 1510, a testing module board 1620, and an ATE 1550. The differences between the RF testing systems 1500 and 1600 are that most components in the testing module board 1520 can be replaced by an integrated circuit 1630 in the testing module board 1620. The testing module board 1620 includes an external loopback path 1621, a power detector 1624, an FPGA 1625, an external memory 1626, a switch 1627, and an integrated circuit 1630. The external loopback path 1621 can be an attenuator so that the test Tx signals can be transmitted to DUT RF receiver 1530 and down-converted to analog test output signals. The power detector 1624 is configured to perform power measurement of the output RF signal from DUT 1510 and aging detection for the integrated chip 1630 in testing module board 1620. The external memory 1626 is configured to store calibration data of the testing module board 1620. The FPGA 1625 is configured to control the external attenuator 1621, the power detector 1624, and the switch 1627 according to command signals from the integrated circuit 1630, and thus the pin counts on the testing module board 1620 can be reduced.

In an embodiment, the integrated circuit 1630 includes a test signal generator 1631, a signal digitizer 1632, an RF self-calibration circuit 1633, a memory 1634, and a processor 1635 having a plurality of processing cores 1635-1~1635-N. The test signal generator is configured to generate baseband one-tone, two-tone, or modulation signals. The signal digitizer 1632 is configured to convert analog test output signals to digital test data. The memory 1634 is for storing test patterns, and calibration data and captured data of the DUT 1510. The RF self-calibration circuit 1633 is configured to perform RF impairment calibration.

The processing core 1635-1 includes a test analyzer 1636-1, and a controller 1637-1, where the test analyzer 1636-1 is similar to the test analyzer 1541 in FIG. 15, and thus the details will be omitted here. The controller 1637-1 may send command signals to the FPGA 1625 to control the power detector 1624 and attenuator 1621 or to the control circuits 1511 to control Rx RF circuits 1530, Tx RF circuits 1520, internal attenuator 1513, and switch 1512. In some embodiments, the calculation of the test results of RF tests can be accelerated by using the processing cores 1635-1~1635-N in parallel (e.g., two or more processing cores runs simultaneously to share the loading of calculation).

In an embodiment, while performing an RF Rx test, the test signal generator 1631 generates an analog test signal to the RF transmitter 1520. If the internal loopback path is selected, the RF signal from the RF transmitter 1520 is sent to the RF receiver 1530 through the internal attenuator 1513. The output signal from the RF receiver 1530 is sent to the signal digitizer 1632, and the signal digitizer 1632 may convert the output signal into digital baseband signals that are then stored in the memory 1634. Alternatively, if the external loopback path is selected, the outgoing RF signal from the RF transmitter 1520 is sent to the external attenuator 1621 through RF Tx pins 1517 of the DUT 1510, and the outgoing RF signal can be fed to the RF receiver 1530. The output signal from the RF receiver 1530 is sent to the signal digitizer 1632, and the signal digitizer 1632 may convert the output signal into digital baseband signals that are then stored in the memory 1634.

In an embodiment, while performing an RF Tx test, the test signal generator 1631 generates an analog test signal to the RF transmitter 1520. In response, the RF transmitter generates an outgoing RF signal according to the analog test signal, and the outgoing RF signal is sent to the external attenuator 1621 through RF Tx pins 1517 or sent to internal attenuator 1513 for looping back to the RF receiver 1530.

The RF receiver 1530 then generates analog test signal to the integrated circuit 1630 for test result analysis.

Moreover, the testing module board 1620 can perform a self calibration process to calibrate its power generated by the test signal generator 1631. In one embodiment, the test signal generator 1631 is coupled to the power detector 1624 via the switch 1627. The power detector 1624 may perform power measurement calibration and aging detection on the test signal. The measurement may then be analyzed by the MCU 1635 and the test signal generator 1631 may be calibrated by the RF self-calibration circuit 1633. The RF calibration circuits can also be used for RF impairment calibration of the RF transmitter 1520 and RF receiver 1530 to improve the test accuracy and coverage.

The structure of FIG. 22 can benefit from using existing or available integrated chip 1630 to implement most functionalities of testing module board 1620, thus decreasing the cost of production/implementation of test module board.

Figure 23:
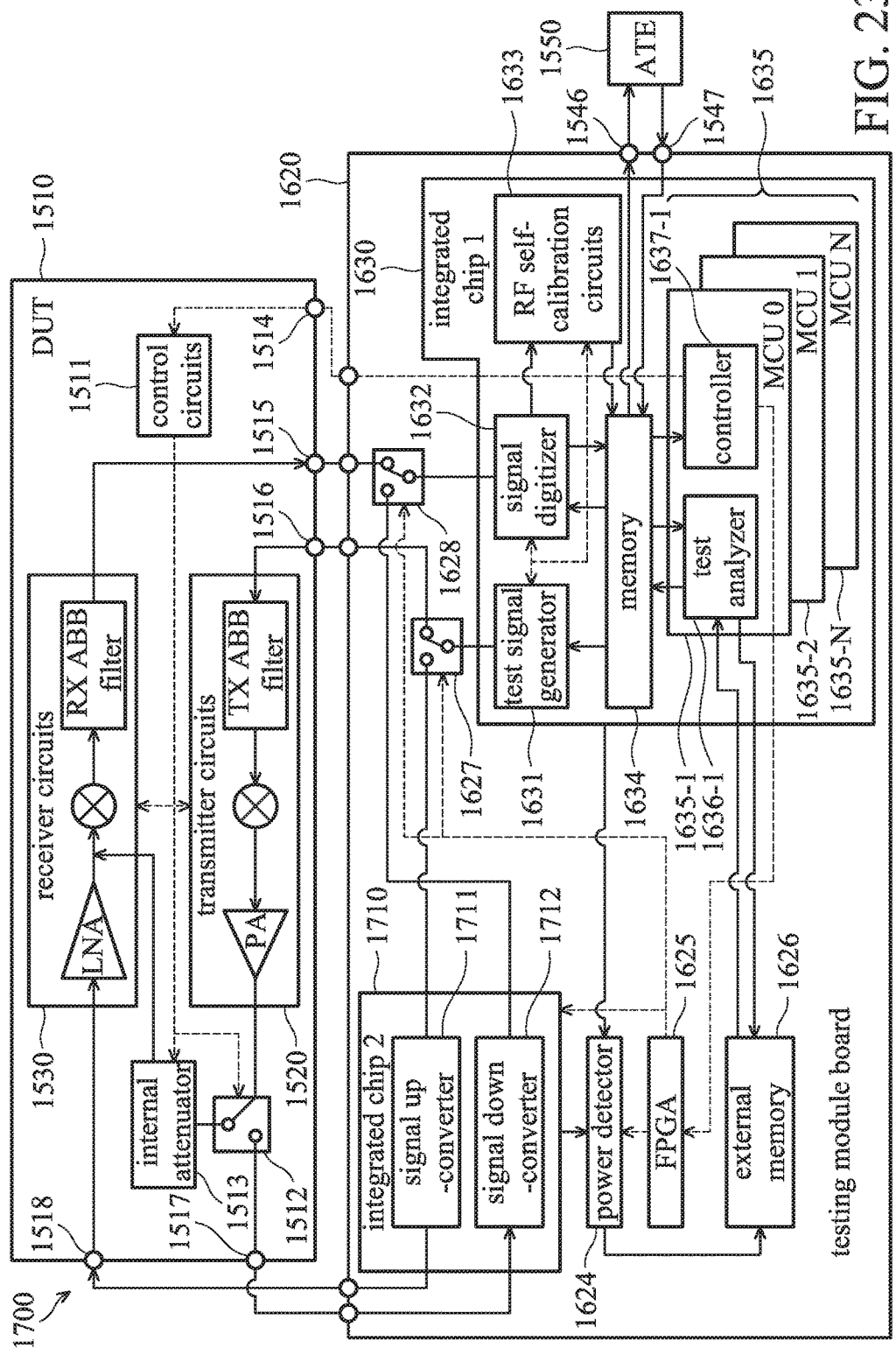
FIG. 23 is a diagram of an RF testing system in accordance with yet another embodiment of the invention.

FIG. 23 is a diagram of an RF testing system in accordance with yet another embodiment of the invention. The RF testing system 1700 is similar to the RF testing 1600 in FIG. 16, and the differences between the RF testing systems 1600 and 1700 are that an integrated circuit 1710 and a switch 1628 are implemented in the testing module board 1620, as shown in FIG. 23. The integrated circuit 1710 includes a signal up-converter 1711, and a signal down-converter 1712. The signal up-converter 1711 is configured to convert analog test signals into RF signals, and the signal down-converter 1712 is configured to convert RF test signals into analog signals.

In an embodiment, while performing an RF Rx test, the test signal generator 1631 generates an analog test signal to the RF transmitter 1520 (i.e. the switch 1627 connects the test signal generator 1631 and the RF transmitter 1520 through analog Tx pins 1516). If the internal loopback path is selected, the outgoing RF signal from the RF transmitter 1520 is sent to the RF receiver 1530 through the internal attenuator 1513. The output signal from the RF receiver 1530 is sent to the signal digitizer 1632 (i.e. the switch 1628 connects the output of the RF receiver 1530 and signal digitizer 1632), and the signal digitizer 1632 may convert the output signal into digital baseband signals that are then stored in the memory 1634. Alternatively, if the external loopback path is selected, the test signal generator 1631 also generates an analog test signal, the switch 1627 connects the output of the test signal generator 1631 to the signal up-converter 1711, and the signal up-converter 1711 up-converts the analog test signal into an RF test signal that is fed into the RF receiver 1530 through RF Rx pins 1518. The output signal from the RF receiver 1530 is sent to the signal digitizer 1632, and the signal digitizer 1632 may convert the output signal into digital baseband signals that are then stored in the memory 1634.

In an embodiment, while performing an RF Tx test, the test signal generator 1631 generates an analog test signal to the RF transmitter 1520. In response, the RF transmitter 1520 generates an outgoing RF signal according to the analog test signal, and the outgoing RF signal from the RF transmitter 1520 is sent to the signal down-converter 1712 through RF Tx pins 1517, and the signal down-converter 1712 may down-convert the outgoing RF signal into an analog signal. The analog signal is then sent to the signal digitizer 1632 and converted into digital baseband signals and stored in the memory 1634. The test analyzer then reports the test results to ATE 1550. Moreover, the power detector may perform power measurement for the analog signal and aging detection for the integrated chip 1 and integrated chip 2.

It should be noted that the integrated circuit 1710 can be used for RF Tx and Rx tests and may increase the test coverage of the RF tests even if the DUT 1510 does not have internal or external loopback paths. This structure of FIG. 23 can benefit from using existing or available integrated chips 1630 and 1710 to implement most functionalities of testing module board 1620, thus decreasing the cost of production/implementation of test module board. In one embodiment, the integrated chip 1630 is a digital die, while the integrated chip 1710 is an analog die.

Figure 24:
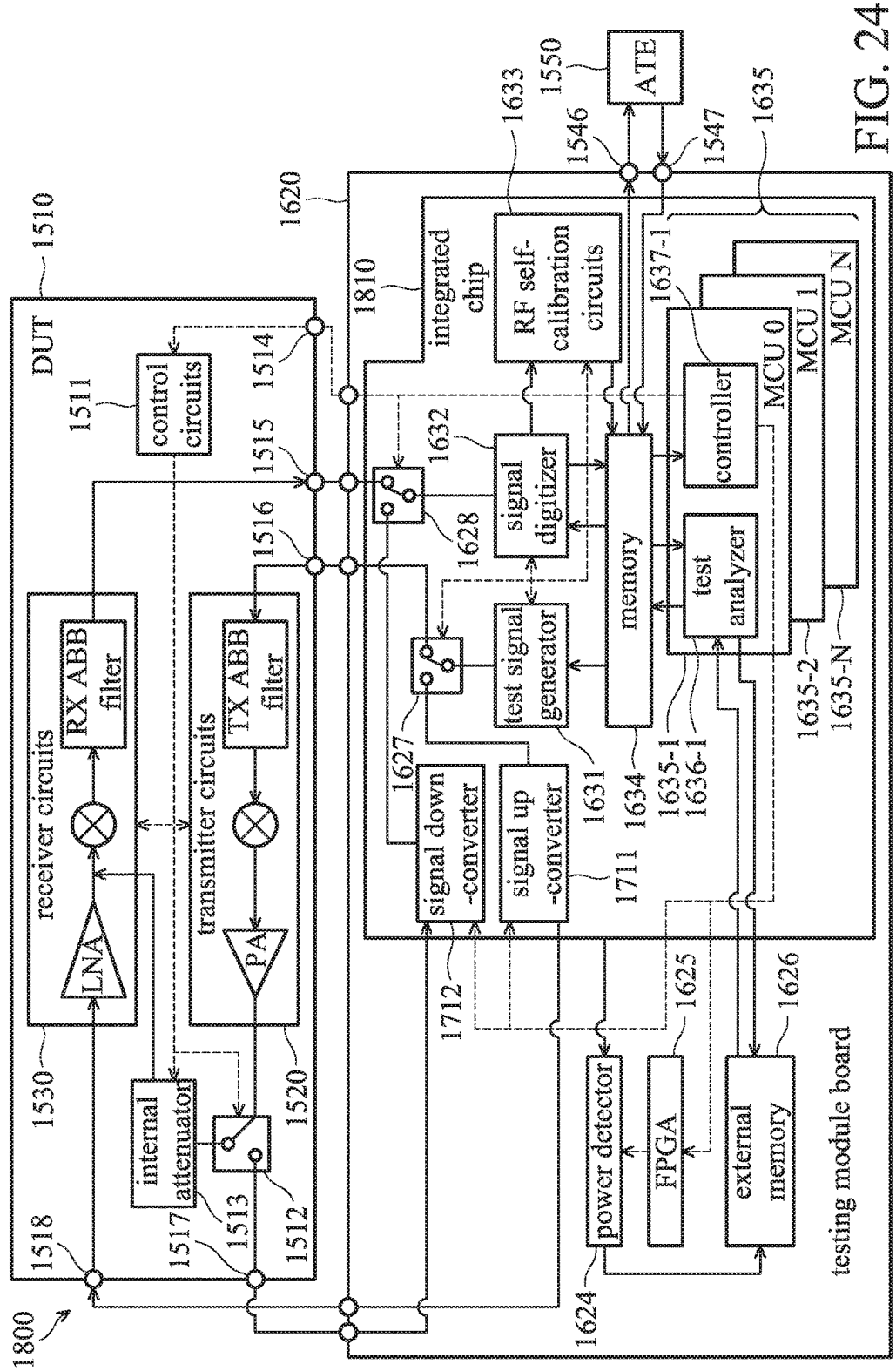
FIG. 24 is a diagram of an RF testing system in accordance with yet another embodiment of the invention.

FIG. 24 is a diagram of an RF testing system in accordance with yet another embodiment of the invention. The RF testing system 1800 is similar to the RF testing 1700 in FIG. 23, and the differences between the RF testing systems 1700 and 1800 are that the signal conversion function is integrated into an integrated circuit 1810 (i.e. a single chip). For example, the signal converter 1710, the integrated circuit 1630, and the switches 1627 and 1628 are fully integrated into the integrated circuit 1810. The operations for performing RF Tx and Rx tests in the RF testing system 1800 are similar to those in the RF testing 1700 in FIG. 23, and thus the details will be omitted here.

It should be noted that the size of the testing module board 1620 can be minimized when the fully integrated circuit 1810 is used on the testing module board 1620. In addition, the test coverage of the RF Tx and Rx tests is also increased with the help of the integrated circuit 1810 even if the DUT 1510 does not have internal or external loopback paths.

In view of the above, various implementations of an RF testing system are disclosed. Given that the DUT is a stand-alone analog or RF integrated circuit, the DUT can be tested by an ATE without any RF instruments, as described in the aforementioned embodiments in FIGS. 21~24. In addition, when the integrated circuit on the testing module board has a plurality of processing cores or processors, the processing cores or processors can be used to calculate the RF test results in parallel, thereby reducing the test time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC), comprising:
   an RF transmitter configured to generate an RF signal in response to an analog test signal from a test signal generator of a module circuitry that is external to the IC;
   an RF receiver configured to generate an outgoing signal according to an input RF signal, and report the outgoing signal to the module circuitry, wherein the module circuitry performs a test analysis on the RF signal generated by the RF transmitter or on the outgoing signal generated by the RF receiver to determine a test result,
   wherein the test result is reported to a test equipment having no RF instruments, wherein the test equipment is configured to initiate an RF build-in-self-test (BIST) on the IC.

2. The IC as claimed in claim 1, furthers comprising:
an internal attenuator configured to attenuate the RF signal from the RF transmitter to generate the input RF signal for the RF receiver.

3. The IC as claimed in claim 1, being a stand-alone RF or analog IC that does not have a digital processing circuit.

4. A module circuitry for testing a device-under-test, comprising:
a test signal generator, configured to generate a test signal;
a test analyzer, configured to performs a test analysis on an RF signal generated by the device-under-test or on an analog signal generated by the device-under-test to determine a test result; and
a controller that controls the test signal generator to generate the test signal and controls the test analyzer to generate the test result, wherein the test signal generator, the test analyzer and the controller are implemented in one integrated circuit, and wherein the integrated circuit further comprises an RF self-calibration circuit configured to calibrate the test signal generator.

5. The module circuitry as claimed in claim 4, further comprising a signal converter and digitizer configured to convert the analog signal into a digital signal for the test analyzer to perform the test analysis.

6. The module circuitry as claimed in claim 4, wherein the integrated circuit comprises a plurality of processing cores that are capable of performing test analysis in parallel.

7. The module circuitry as claimed in claim 4, further comprising a power detector, a signal converter, and a field-programmable gate array (FPGA).

8. The module circuitry as claimed in claim 4, further comprising a signal converter comprising a signal up-converter and a signal down-converter, and the signal converter is implemented in one integrated circuit.

9. The module circuitry as claimed in claim 8, wherein the test signal generator, the test analyzer and the controller are implemented in a first integrated circuit, and the signal converter is implemented in a second integrated circuit.

10. The module circuitry as claimed in claim 8, wherein the test signal generator, the test analyzer, the controller and the signal converter are implemented in one integrated circuit.

11. The module circuitry as claimed in claim 4, wherein the test signal generator generates the test signal based on test patterns received from a test equipment, and the test equipment is not equipped with RF instruments.

12. A radio frequency (RF) testing system, comprising:
a module circuitry;
a test equipment, configured to upload test patterns to the module circuitry; and
a device-under-test configured to generate an RF signal or an analog signal in response to a test signal from the module circuitry, wherein the module circuitry generates the test signal according to the uploaded test patterns,
wherein the module circuitry performs a test analysis on the RF signal or the analog signal to determine a test result, and the test equipment receives the test result from the module circuitry,
wherein the module circuitry is external to the IC and the test equipment.

13. The RF testing system as claimed in claim 12, wherein the test equipment does not have RF instrument.

14. The RF testing system as claimed in claim 12, wherein the device-under-test is a stand-alone RF or analog IC.

15. The RF testing system as claimed in claim 12, wherein the module circuitry comprises:
a test signal generator, configured to generate the test signal;
a test analyzer, configured to performs the test analysis on the RF signal or the analog signal generated by the device-under-test to determine the test result; and
a controller that controls the test signal generator to generate the test signal and controls the test analyzer to generate the test result.

16. The RF testing system as claimed in claim 12, wherein the module circuitry comprises:
an integrated circuit, comprising:
a test signal generator, configured to generate the test signal according to the uploaded test patterns; and
a processor, configured to perform the test analysis and test flow control.

17. The RF testing system as claimed in claim 12, wherein the module circuitry comprises:
a first integrated circuit, comprising:
a signal up-converter, configured to up-convert the test signal into an RF test signal; and
a signal down-converter, configured to down-convert the RF signal into a baseband signal; and
a second integrated circuit, comprising:
a test signal generator, configured to generate the test signal according to the uploaded test patterns; and
a processor, configured to perform the test analysis and test flow control.

18. The RF testing system as claimed in claim 12, wherein the module circuitry comprises:
an integrated circuit, comprising:
a test signal generator, configured to generate the test signal according to the uploaded test patterns;
a signal up-converter, configured to up-convert the test signal into an RF test signal; and
a signal down-converter, configured to down-convert the RF signal into a baseband signal; and
a processor, configured to perform the test analysis and test flow control.

19. The RF testing system as claimed in claim 16, wherein the processor comprises a plurality of processing cores that are capable of performing the test analysis in parallel.

20. The RF testing system as claimed in claim 17, wherein the processor comprises a plurality of processing cores that are capable of performing the test analysis in parallel.

21. The RF testing system as claimed in claim 18, wherein the processor comprises a plurality of processing cores that are capable of performing the test analysis in parallel.

* * * * *